(12) United States Patent
Furuha

(10) Patent No.: US 11,374,151 B2
(45) Date of Patent: Jun. 28, 2022

(54) LIGHT-EMITTING DEVICE

(71) Applicant: NICHIA CORPORATION, Anan (JP)

(72) Inventor: Naoto Furuha, Kaifu-gun (JP)

(73) Assignee: NICHIA CORPORATION, Anan (JP)

( * ) Notice: Subject to any disclaimer, the term of this patent is extended or adjusted under 35 U.S.C. 154(b) by 198 days.

(21) Appl. No.: 16/927,256

(22) Filed: Jul. 13, 2020

(65) Prior Publication Data

US 2021/0028330 A1    Jan. 28, 2021

(30) Foreign Application Priority Data

Jul. 23, 2019   (JP) .............................. JP2019-135499

(51) Int. Cl.
| | |
|---|---|
| *H01L 33/38* | (2010.01) |
| *H01L 25/075* | (2006.01) |
| *H01L 27/15* | (2006.01) |
| *H01L 33/62* | (2010.01) |
| *H01L 33/32* | (2010.01) |

(52) U.S. Cl.
CPC ........ *H01L 33/382* (2013.01); *H01L 25/0753* (2013.01); *H01L 27/15* (2013.01); *H01L 27/153* (2013.01); *H01L 33/32* (2013.01); *H01L 33/62* (2013.01)

(58) Field of Classification Search
CPC ... H01L 33/382; H01L 25/0753; H01L 27/15; H01L 27/153; H01L 33/32; H01L 33/62
See application file for complete search history.

(56) References Cited

U.S. PATENT DOCUMENTS

| | | | |
|---|---|---|---|
| 9,412,907 B1* | 8/2016 | Place | ...................... H01L 33/08 |
| 2010/0012968 A1 | 1/2010 | Yahata et al. | |
| 2013/0050653 A1 | 2/2013 | Miyachi et al. | |
| 2015/0249196 A1* | 9/2015 | Williams | .............. H01L 33/382 |
| | | | 257/88 |
| 2016/0240759 A1* | 8/2016 | Chae | ...................... H01L 33/62 |
| 2017/0210277 A1 | 7/2017 | Harada et al. | |

FOREIGN PATENT DOCUMENTS

| | | |
|---|---|---|
| EP | 3 182 451 A1 | 6/2017 |
| JP | 2010-027824 A | 2/2010 |
| JP | 2013-055186 A | 3/2013 |
| JP | 2017-112166 A | 6/2017 |
| JP | 2017-130617 A | 7/2017 |

* cited by examiner

*Primary Examiner* — Su C Kim
(74) *Attorney, Agent, or Firm* — Birch, Stewart, Kolasch & Birch, LLP

(57) ABSTRACT

A light-emitting device includes a semiconductor stacked body having first and second semiconductor layers. The second semiconductor layer includes conductive portions contacting a second conductive layer and having island configurations. The conductive portions are disposed in a first region, a second region, a third region, and a fourth region. The first region is positioned at a periphery of a first corner of the semiconductor stacked body. The second region is positioned at a periphery of a second corner of the semiconductor stacked body. The third region is positioned at a periphery of a third corner of the semiconductor stacked body. The fourth region is positioned at a periphery of a fourth corner of the semiconductor stacked body. A density of the conductive portions disposed in the first region is greater than densities of the conductive portions disposed in the second region, the third region, and the fourth region.

7 Claims, 18 Drawing Sheets

LIGHT-EMITTING DEVICE

CROSS-REFERENCE TO RELATED APPLICATION

This application claims priority to Japanese Patent Application No. 2019-135499, filed on Jul. 23, 2019, the disclosure of which is hereby incorporated by reference in its entirety.

BACKGROUND

The present disclosure relates to a light-emitting device.

For example, a semiconductor light-emitting element array discussed in Japanese Patent Publication No. 2013-55186 includes multiple semiconductor light-emitting elements disposed on a substrate and connected in series. When a current flows from one light-emitting element of two adjacent light-emitting elements to another light-emitting element of the two adjacent light-emitting elements in such a semiconductor light-emitting element array, a region easily occurs where the current density is relatively low due to the arrangement of the electrodes, etc., which may cause an uneven luminance distribution.

SUMMARY

The present disclosure is directed embodiments that suppress an uneven luminance distribution in a light-emitting device including multiple light-emitting elements connected in series.

According to one embodiment, a light-emitting device includes: a first pad electrode; a second pad electrode disposed to be separated from the first pad electrode; a first semiconductor stacked body disposed between the first pad electrode and the second pad electrode in a first direction, the first direction being from the first pad electrode toward the second pad electrode, the first semiconductor stacked body including a first semiconductor layer of a first conductivity type, a second semiconductor layer of a second conductivity type, and a first light-emitting layer disposed between the first semiconductor layer and the second semiconductor layer; a third pad electrode next to the first pad electrode in a second direction orthogonal to the first direction; a fourth pad electrode next to the second pad electrode in the second direction and disposed to be separated from the third pad electrode in the first direction; a second semiconductor stacked body disposed between the third pad electrode and the fourth pad electrode in the first direction, the second semiconductor stacked body including a third semiconductor layer of the first conductivity type, a fourth semiconductor layer of the second conductivity type, and a second light-emitting layer disposed between the third semiconductor layer and the fourth semiconductor layer; a first conductive layer electrically connecting the first semiconductor layer and the first pad electrode; a second conductive layer electrically connecting the second semiconductor layer and the second pad electrode; a third conductive layer electrically connecting the third semiconductor layer and the fourth pad electrode; a fourth conductive layer electrically connecting the fourth semiconductor layer and the third pad electrode; and a conductive member electrically connecting the second pad electrode and the fourth pad electrode. The second semiconductor layer includes a plurality of conductive portions contacting the second conductive layer and having island configurations. The first semiconductor stacked body has a first side along the first direction, a second side along the first direction, a third side along the second direction, and a fourth side along the second direction. The second side is disposed between the first side and the second semiconductor stacked body. The fourth side is disposed between the third side and the second pad electrode. The conductive portions are disposed in a first region, a second region, a third region, and a fourth region. The first region is positioned at a periphery of a first corner between the first side and the fourth side of the first semiconductor stacked body. The second region is positioned at a periphery of a second corner between the first side and the third side of the first semiconductor stacked body. The third region is positioned at a periphery of a third corner between the second side and the third side of the first semiconductor stacked body. The fourth region is positioned at a periphery of a fourth corner between the second side and the fourth side of the first semiconductor stacked body. A density of the conductive portions disposed in the first region is greater than densities of the conductive portions disposed in the second region, the third region, and the fourth region.

According to another embodiment, a light-emitting device includes: a first pad electrode; a second pad electrode disposed to be separated from the first pad electrode; a first semiconductor stacked body disposed between the first pad electrode and the second pad electrode in a first direction, the first direction being from the first pad electrode toward the second pad electrode, the first semiconductor stacked body including a first semiconductor layer of a first conductivity type, a second semiconductor layer of a second conductivity type, and a first light-emitting layer disposed between the first semiconductor layer and the second semiconductor layer; a third pad electrode next to the first pad electrode in a second direction orthogonal to the first direction; a fourth pad electrode next to the second pad electrode in the second direction and disposed to be separated from the third pad electrode in the first direction; a second semiconductor stacked body including a third semiconductor layer of the first conductivity type, a fourth semiconductor layer of the second conductivity type, and a second light-emitting layer disposed between the third semiconductor layer and the fourth semiconductor layer; a first conductive layer electrically connecting the first semiconductor layer and the first pad electrode; a second conductive layer electrically connecting the second semiconductor layer and the second pad electrode; a third conductive layer electrically connecting the third semiconductor layer and the fourth pad electrode; a fourth conductive layer electrically connecting the fourth semiconductor layer and the third pad electrode; and a conductive member electrically connecting the second pad electrode and the fourth pad electrode. The second semiconductor layer includes conductive portions including a plurality of first conductive portions and a plurality of second conductive portions. The first conductive portions contact the second conductive layer and have island configurations having first diameters. The second conductive portions contact the second conductive layer and have island configurations having second diameters greater than the first diameters. The first semiconductor stacked body has a first side along the first direction, a second side along the first direction, a third side along the second direction, and a fourth side along the second direction. The second side is disposed between the first side and the second semiconductor stacked body. The fourth side is disposed between the third side and the second pad electrode. The conductive portions are disposed in a first region, a second region, a third region, and a fourth region. The first region is positioned at a periphery of a first corner between the first side and the fourth side of the first semiconductor stacked body. The second region is positioned at a periphery of a second corner between the first side and the third side of the first semiconductor stacked body. The third region is positioned at a periphery of a third corner between the second side and the third side of the first semiconductor stacked body. The fourth region is positioned at a periphery of a fourth corner between the second side and the fourth side of the first semiconductor stacked body. A density of the second conductive portions disposed in the first region is greater than densities of the second conductive portions disposed in the second region, the third region, and the fourth region.

According to another embodiment, a light-emitting device includes: a first pad electrode; a second pad electrode disposed to be separated from the first pad electrode; a first semiconductor stacked body disposed between the first pad electrode and the second pad electrode in a first direction, the first direction being from the first pad electrode toward the second pad electrode, the first semiconductor stacked body including a first semiconductor layer of a first conductivity type, a second semiconductor layer of a second conductivity type, and a first light-emitting layer disposed between the first semiconductor layer and the second semiconductor layer; a third pad electrode next to the first pad electrode in a second direction orthogonal to the first direction; a fourth pad electrode next to the second pad electrode in the second direction and disposed to be separated from the third pad electrode in the first direction; a second semiconductor stacked body including a third semiconductor layer of the first conductivity type, a fourth semiconductor layer of the second conductivity type, and a second light-emitting layer disposed between the third semiconductor layer and the fourth semiconductor layer; a first conductive layer electrically connecting the first semiconductor layer and the first pad electrode; a second conductive layer electrically connecting the second semiconductor layer and the second pad electrode; a third conductive layer electrically connecting the third semiconductor layer and the fourth pad electrode; a fourth conductive layer electrically connecting the fourth semiconductor layer and the third pad electrode; a conductive member electrically connecting the second pad electrode and the fourth pad electrode; and a first electrode disposed on the first semiconductor layer. The second semiconductor layer includes a plurality of conductive portions contacting the second conductive layer and having island configurations. The first semiconductor stacked body has a first side along the first direction, a second side along the first direction, a third side along the second direction, and a fourth side along the second direction. The second side is disposed between the first side and the second semiconductor stacked body. The fourth side is disposed between the third side and the second pad electrode. The first electrode includes a plurality of connection portions extending along the first direction from a vicinity of the third side toward the fourth side of the first semiconductor stacked body. The plurality of connection portions contacts the first conductive layer. The plurality of connection portions includes a first connection portion and a second connection portion. The first connection portion extends toward a first region positioned at a periphery of a first corner between the first side and the fourth side of the first semiconductor stacked body. The second connection portion is disposed between the first connection portion and the second side, and is shorter in the first direction than the first connection portion.

According to certain embodiments of the present disclosure, an uneven luminance distribution in a light-emitting device including multiple light-emitting elements connected in series can be suppressed.

DETAILED DESCRIPTION

Figure 1:
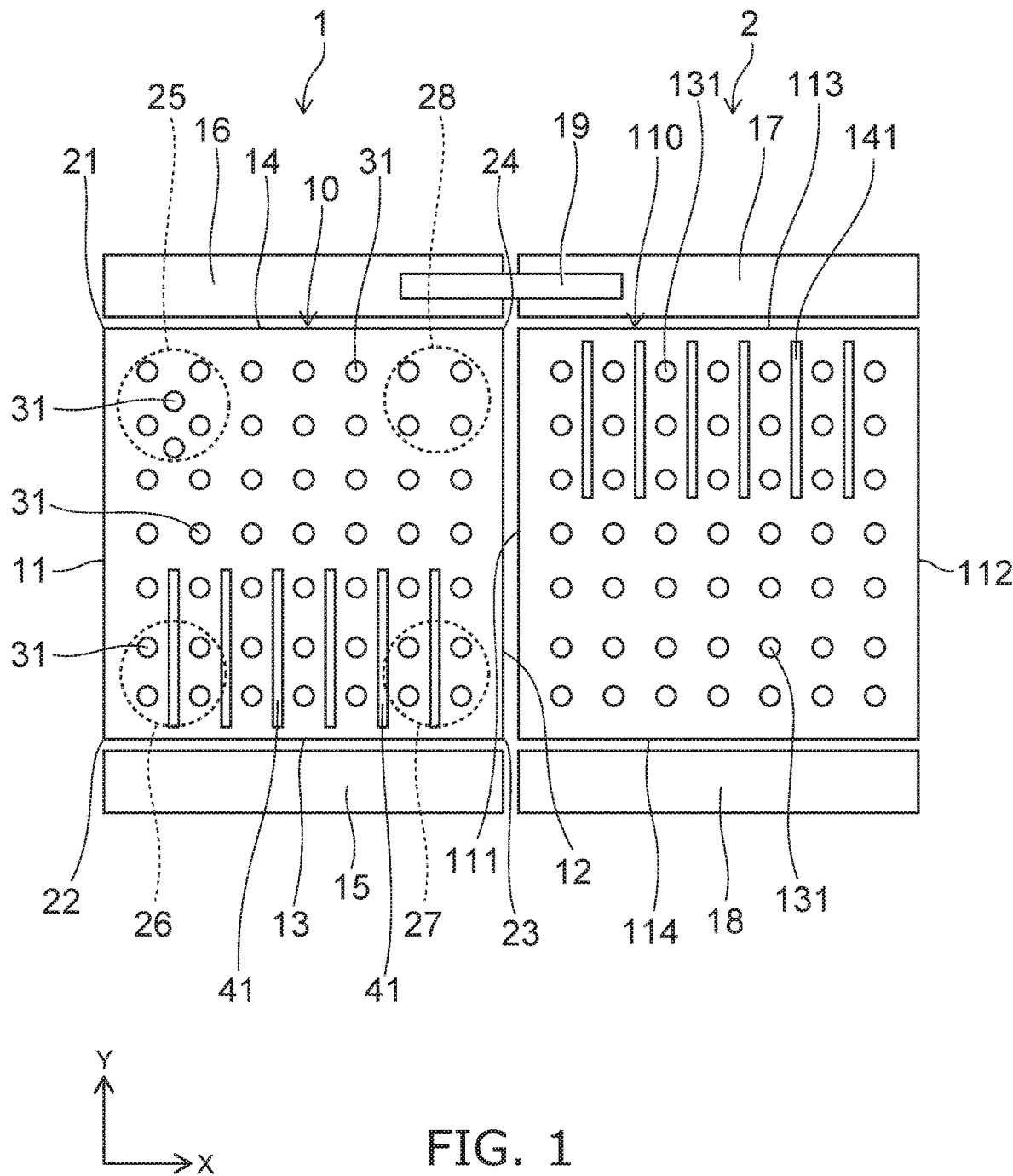
FIG. 1 is a schematic plan view showing an arrangement relationship of major components of a light-emitting device of an embodiment of the invention.

Embodiments will now be described with reference to the drawings. The same components in the drawings are labeled with the same reference numerals.

Figure 2:
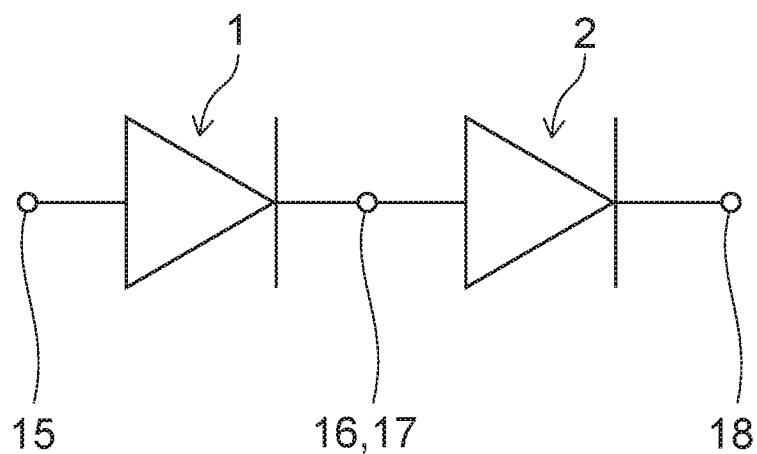
FIG. 2 is an equivalent circuit diagram of the light-emitting device shown in FIG. 1.

FIG. 1 is a schematic plan view showing the arrangement relationship of the major components of a light-emitting device of an embodiment of the invention. FIG. 2 is an equivalent circuit diagram of the light-emitting device shown in FIG. 1.

The light-emitting device includes a first light-emitting element 1 and a second light-emitting element 2. The first light-emitting element 1 includes a first semiconductor stacked body 10, a first pad electrode 15, and a second pad electrode 16. The second light-emitting element 2 includes a second semiconductor stacked body 110, a third pad electrode 18, and a fourth pad electrode 17.

As shown in FIG. 2, the first light-emitting element 1 is connected to the first pad electrode 15, the second pad electrode 16, and the fourth pad electrode 17. The second light-emitting element 2 is connected to the second pad electrode 16, the fourth pad electrode 17, and the third pad electrode 18. The second pad electrode 16 and the fourth pad electrode 17 are electrically connected to each other, and the first light-emitting element 1 and the second light-emitting element 2 are connected in series.

As shown in FIG. 1, the first pad electrode 15 and the second pad electrode 16 are disposed to be separated from each other. The direction from the first pad electrode 15 toward the second pad electrode 16 is taken as a first direction Y. The first semiconductor stacked body 10 is disposed between the first pad electrode 15 and the second pad electrode 16 in the first direction Y.

The third pad electrode 18 is next to the first pad electrode 15 in a second direction X orthogonal to the first direction Y. The first pad electrode 15 and the third pad electrode 18 are disposed to be separated in the second direction X. Here, unless specified otherwise, "orthogonal" includes the case where straight lines in two directions are within about ±5° from 90°.

The fourth pad electrode 17 is disposed to be separated from the third pad electrode 18 in the first direction Y. The fourth pad electrode 17 is next to the second pad electrode 16 in the second direction X. The second pad electrode 16 and the fourth pad electrode 17 are electrically connected to each other by a conductive member 19. The conductive member 19 is, for example, a metal wire.

The second semiconductor stacked body 110 is disposed between the third pad electrode 18 and the fourth pad electrode 17 in the first direction Y. The first semiconductor stacked body 10 and the second semiconductor stacked body 110 are arranged in the second direction X.

In a top view, the configuration of the first semiconductor stacked body 10 is, for example, rectangular. The first semiconductor stacked body 10 has a first side 11 along the first direction Y, a second side 12 that is along the first direction Y and disposed between the first side 11 and the second semiconductor stacked body 110, a third side 13 along the second direction X, and a fourth side 14 that is along the second direction X and disposed between the third side 13 and the second pad electrode 16. The third side 13 is disposed between the fourth side 14 and the first pad electrode 15.

The first semiconductor stacked body 10 includes a first region 25 positioned at the periphery of a first corner 21 between the first side 11 and the fourth side 14, a second region 26 positioned at the periphery of a second corner 22 between the first side 11 and the third side 13, a third region 27 positioned at the periphery of a third corner 23 between the second side 12 and the third side 13, and a fourth region 28 positioned at the periphery of a fourth corner 24 between the second side 12 and the fourth side 14.

In a top view, the configuration of the second semiconductor stacked body 110 is, for example, rectangular. The second semiconductor stacked body 110 has a first side 111 along the first direction Y, a second side 112 along the first direction Y, a third side 113 along the second direction X, and a fourth side 114 along the second direction X. The third side 113 is disposed between the fourth side 114 and the fourth pad electrode 17. The fourth side 114 is disposed between the third side 113 and the third pad electrode 18. The first side 111 is next to the second side 12 of the first semiconductor stacked body 10. A pad electrode is not disposed between the second side 12 of the first semiconductor stacked body 10 and the first side 111 of the second semiconductor stacked body 110.

Figure 3:
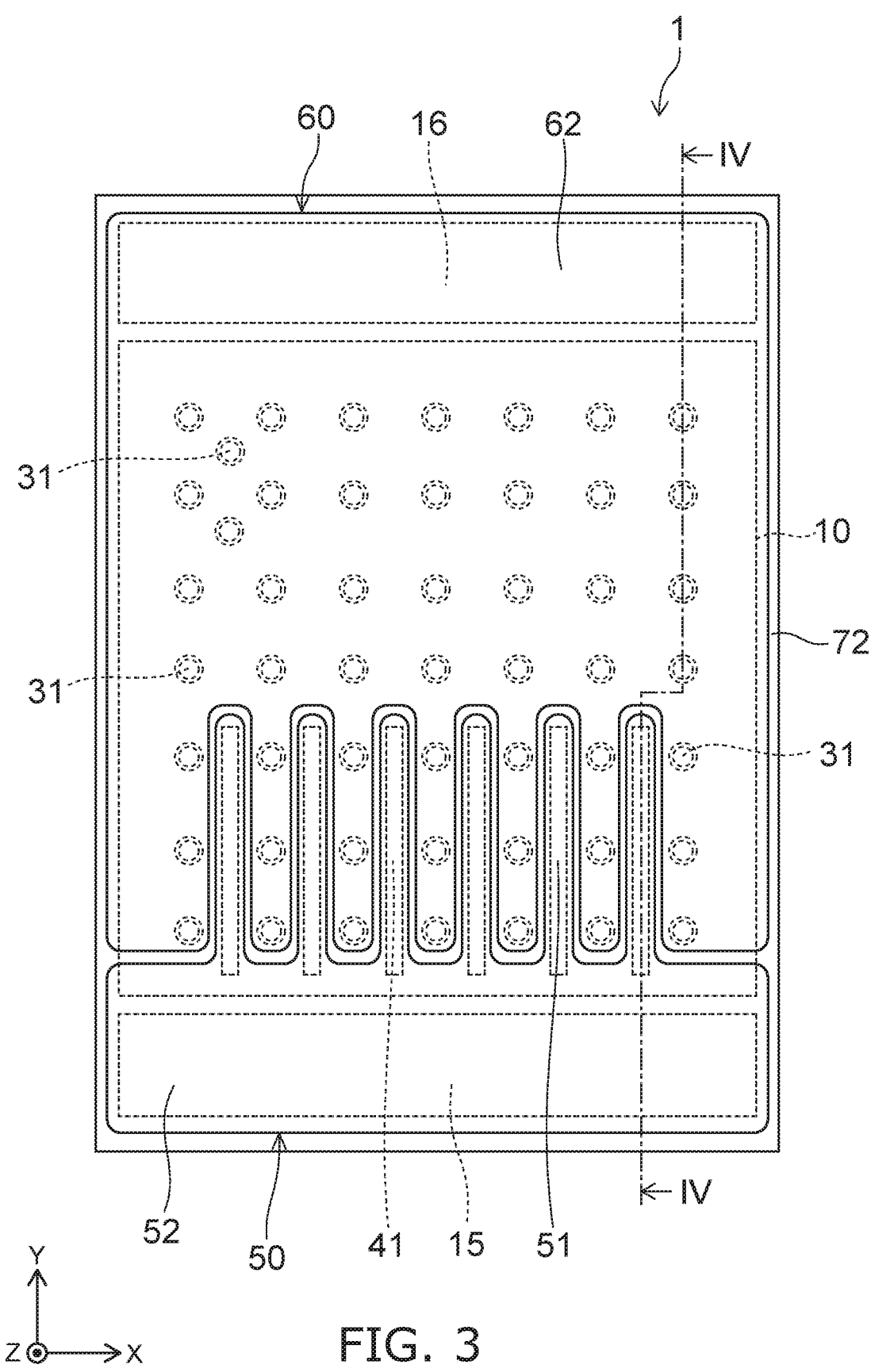
FIG. 3 is a schematic plan view of a first light-emitting element of the light-emitting device shown in FIG. 1.
Figure 4:
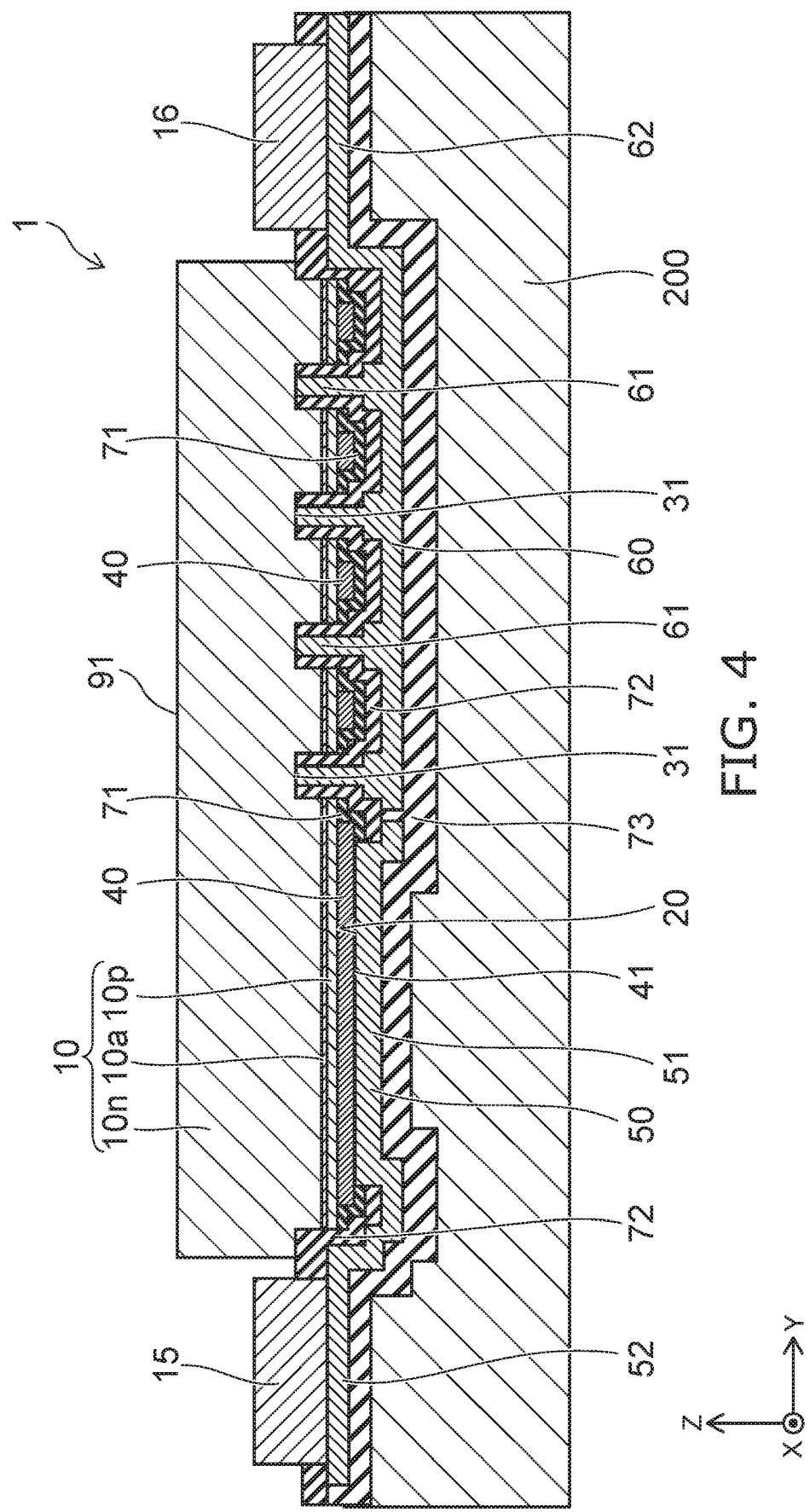
FIG. 4 is a schematic cross-sectional view along line IV-IV of FIG. 3.

FIG. 3 is a schematic plan view of the first light-emitting element 1. FIG. 4 is a schematic cross-sectional view along line IV-IV of FIG. 3.

As shown in FIG. 4, the first semiconductor stacked body 10 of the first light-emitting element 1 is disposed on a substrate 200. The substrate 200 includes, for example, a silicon substrate. The direction from the substrate 200 toward the first semiconductor stacked body 10 is taken as a third direction Z. The third direction Z is orthogonal to the first direction Y and the second direction X.

A first conductive layer 50, a second conductive layer 60, the first pad electrode 15, and the second pad electrode 16 are disposed on the substrate 200. The first conductive layer 50 and the second conductive layer 60 include, for example, at least one selected from the group consisting of Al, Ti, Pt, Ni, and Cu. An insulating layer 72 is disposed partially between the first conductive layer 50 and the first semiconductor stacked body 10 and between the second conductive layer 60 and the first semiconductor stacked body 10. An insulating layer 73 that is formed at surfaces of the first conductive layer 50 and the second conductive layer 60 is disposed between the first conductive layer 50 and the substrate 200 and between the second conductive layer 60 and the substrate 200.

Figure 5:
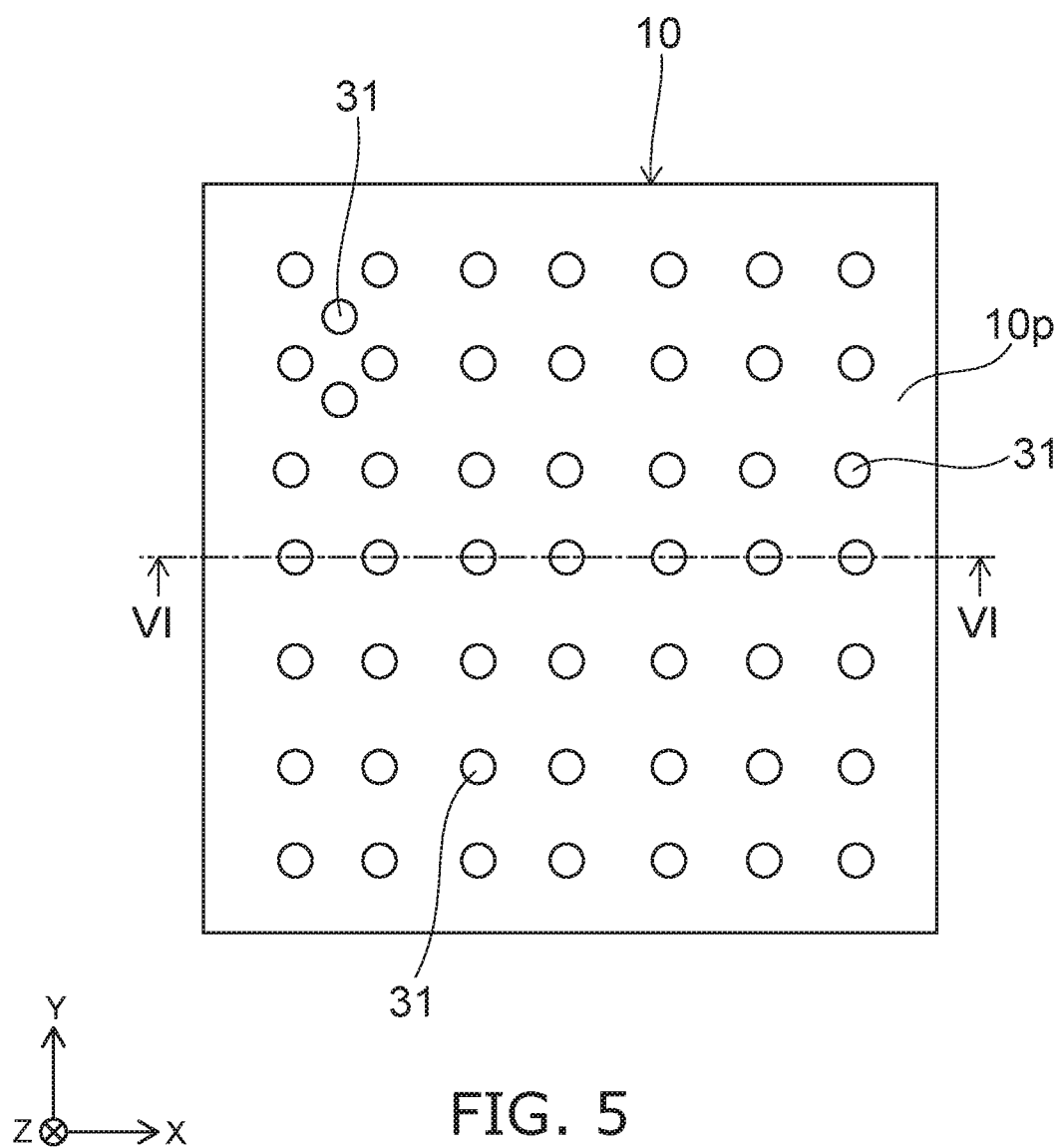
FIG. 5 is a schematic plan view of the first semiconductor stacked body of the first light-emitting element.
Figure 6:
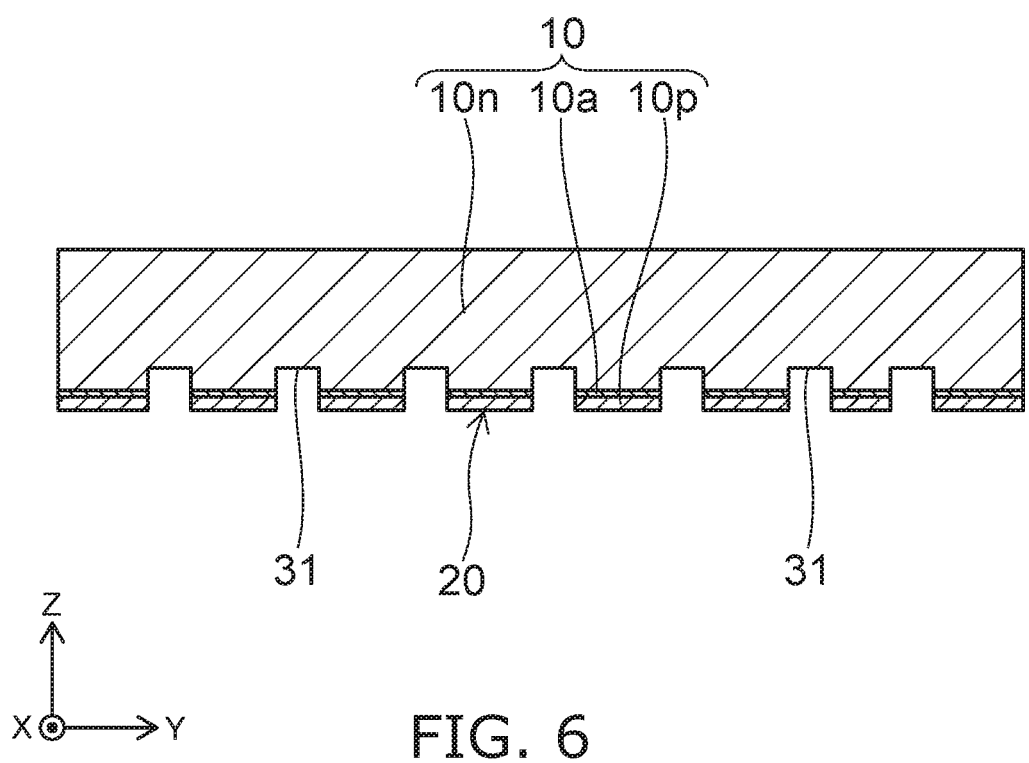
FIG. 6 is a schematic cross-sectional view along line VI-VI of FIG. 5.

FIG. 5 is a schematic plan view of the first semiconductor stacked body 10. FIG. 6 is a schematic cross-sectional view along line VI-VI of FIG. 5.

In the description hereinbelow, a first conductivity type is described as a p-type, and a second conductivity type is described as an n-type. The first conductivity type may be the n-type, and the second conductivity type may be the p-type.

The first semiconductor stacked body 10 includes a first semiconductor layer 10p of the p-type, a first light-emitting layer 10a, and a second semiconductor layer 10n of the n-type. The first light-emitting layer 10a is disposed between the first semiconductor layer 10p and the second semiconductor layer 10n in the third direction Z. As shown in FIG. 4, the first semiconductor layer 10p is disposed between the substrate 200 and the first light-emitting layer 10a in the third direction Z. The first semiconductor stacked body 10 favorably includes, for example, a nitride semiconductor such as $In_XAl_YGa_{1-X-Y}N$ ($0 \leq X$, $0 \leq Y$, and $X+Y<1$), etc.

The second semiconductor layer 10n includes multiple conductive portions 31 having island configurations. The first semiconductor layer 10p and the first light-emitting layer 10a are not disposed at the conductive portions 31. The conductive portions 31 are the portions electrically connected to the second conductive layer 60.

The first semiconductor stacked body 10 includes a mesa portion 20 in which the first semiconductor layer 10p, the first light-emitting layer 10a, and the second semiconductor layer 10n are stacked. In a plan view, the mesa portion 20 surrounds the peripheries of the conductive portions 31 as shown in FIG. 5.

As shown in FIG. 4, a first electrode 40 is disposed at a surface of the first semiconductor layer 10p of the mesa portion 20. The first electrode 40 is electrically connected to the first semiconductor layer 10p. The first electrode 40 includes, for example, a reflective layer including at least one selected from the group consisting of Ag and Al. The first electrode 40 can have a stacked structure including a reflective layer and a metal layer including at least one selected from the group consisting of Ni, Ti, and Pt. For example, the first electrode 40 can have a stacked structure in which Ag, Ni, Ti, and Pt are stacked in order from the first semiconductor layer 10p side.

An insulating film 71 is disposed at a portion of a surface of the first semiconductor layer 10p to cover the first electrode 40. The insulating film 71 has openings on the first electrode 40, and the first electrode 40 and the first conductive layer 50 are connected in the openings. Connection portions 41 that connect the first electrode 40 and the first conductive layer 50 are positioned in the regions where the openings of the insulating film 71 are disposed. The insulating layer 72 is disposed to cover the insulating film 71 and the side surface of the mesa portion 20. The insulating films 71 and 72 are, for example, silicon oxide films and/or silicon nitride films.

Figure 7:
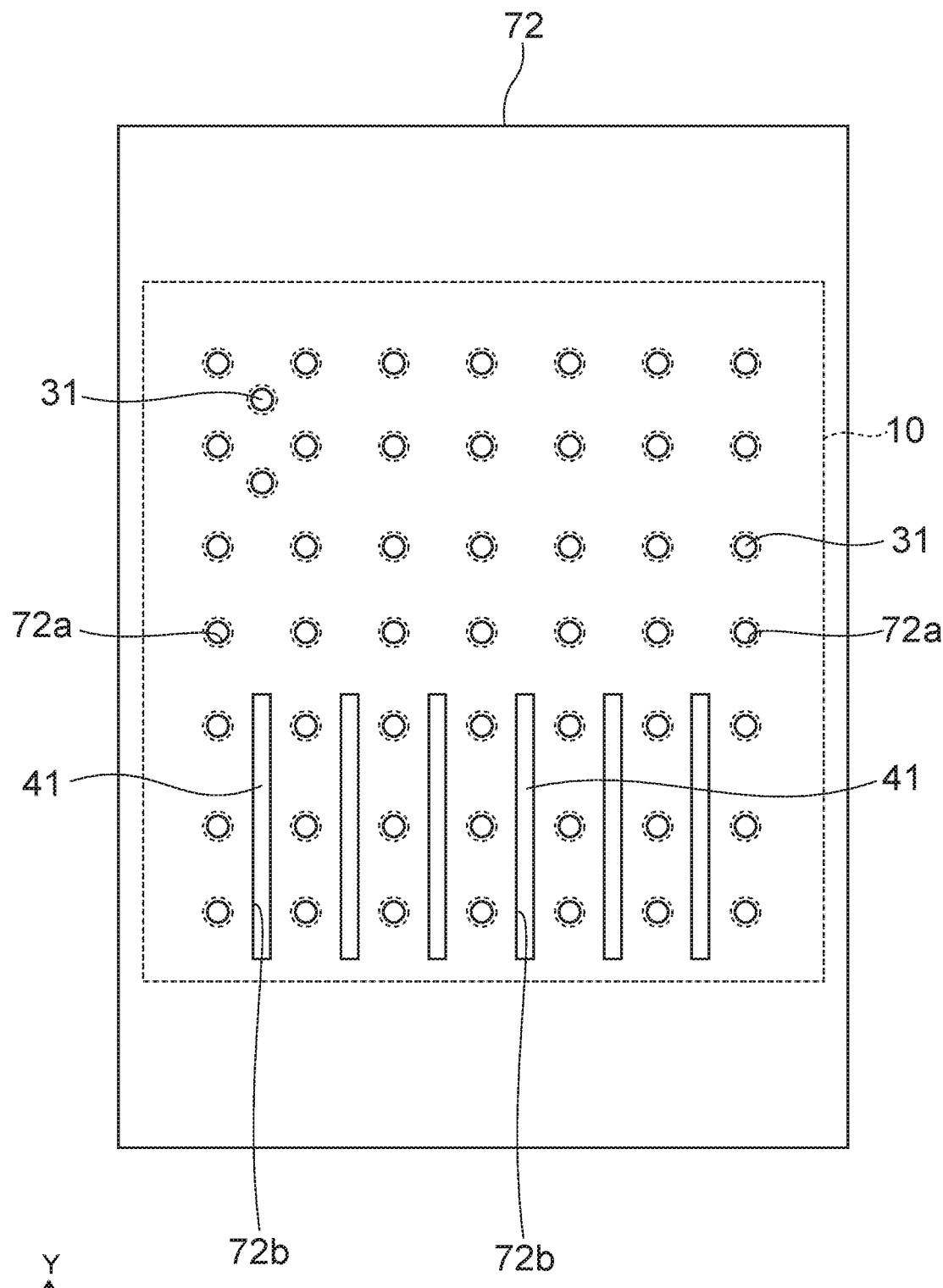
FIG. 7 is a schematic plan view showing an arrangement relationship of major components of the first light-emitting element.

FIG. 7 is a schematic plan view showing the arrangement relationship between the insulating layer 72 and the first semiconductor stacked body 10.

The insulating layer 72 extends in the first direction Y beyond the portion where the first semiconductor stacked body 10 is positioned. The insulating layer 72 has multiple first openings 72a and multiple second openings 72b. The conductive portions 31 of the second semiconductor layer 10n are positioned in the first openings 72a. The connection portions 41 of the first electrode 40 are positioned in the second openings 72b. The first conductive layer 50 and the second conductive layer 60 are disposed on the insulating layer 72.

Figure 8:
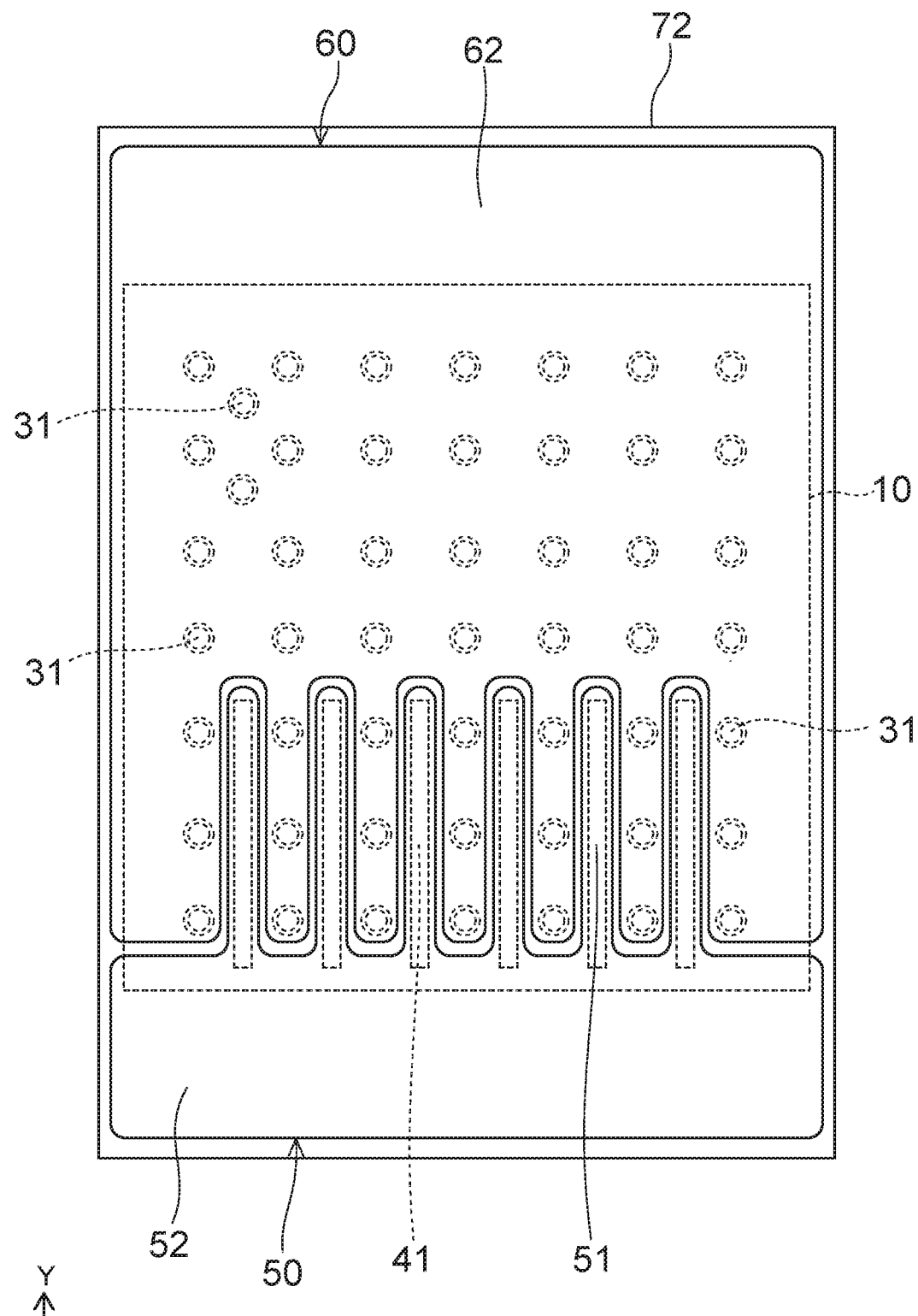
FIG. 8 is a schematic plan view showing an arrangement relationship of major components of the first light-emitting element.

FIG. 8 is a schematic plan view showing the arrangement relationship of the first conductive layer 50 and the second conductive layer 60 on the substrate 200.

The first conductive layer 50 includes first portions 51 and a second portion 52. The first portions 51 and the second portion 52 are formed to have a continuous body of the same material (e.g., a metal material).

The first portions 51 are connected to the connection portions 41 of the first electrode 40 via the openings of the insulating layer 72 and the insulating film 71 shown in FIG. 4. As shown in FIG. 7, the multiple connection portions 41 that extend along the first direction Y are arranged in the second direction X. As shown in FIG. 8, the multiple first portions 51 are disposed to correspond to the multiple connection portions 41.

The second portion 52 is positioned outside the first semiconductor stacked body 10 in the first direction Y. The first portions 51 extend along the first direction Y from the second portion 52 toward the first semiconductor stacked body 10 side. The multiple first portions 51 are separated from each other in the second direction X.

The second conductive layer 60 includes first portions 61 and a second portion 62. The first portions 61 and the second portion 62 are formed to have a continuous body of the same material (e.g., a metal material).

As shown in FIG. 4, the first portions 61 are connected to the conductive portions 31 of the second semiconductor layer 10n via the openings of the insulating layer 72. The first portions 61 are connected respectively to the multiple conductive portions 31. The second portion 62 is positioned outside the first semiconductor stacked body 10 in the first direction Y.

As shown in FIG. 8, in a plan view, the first semiconductor stacked body 10 is positioned between the second portion 52 of the first conductive layer 50 and the second portion 62 of the second conductive layer 60 in the first direction Y.

As shown in FIG. 4, the first pad electrode 15 is disposed on the second portion 52 of the first conductive layer 50. The second portion 52 is electrically connected to the first pad electrode 15. The first pad electrode 15 is electrically connected to the first semiconductor layer 10p via the second portion 52 and the first portions 51 of the first conductive layer 50 and the first electrode 40. The first pad electrode 15 includes, for example, at least one selected from the group consisting of Ti, Pt, and Au. For example, the first pad electrode 15 can have a stacked structure in which Ti, Pt, and Au are stacked in order from the first conductive layer 50 side.

The second pad electrode 16 is disposed on the second portion 62 of the second conductive layer 60. The second portion 62 is electrically connected to the second pad electrode 16. The second pad electrode 16 is electrically connected to the second semiconductor layer 10n via the second portion 62 and the first portions 61 of the second conductive layer 60. The second pad electrode 16 can include a material similar to that of the first pad electrode 15 described above. For example, the second pad electrode 16 can have a structure including a metal material similar to that of the first pad electrode 15 described above.

The second light-emitting element 2 will now be described.

Figure 9:
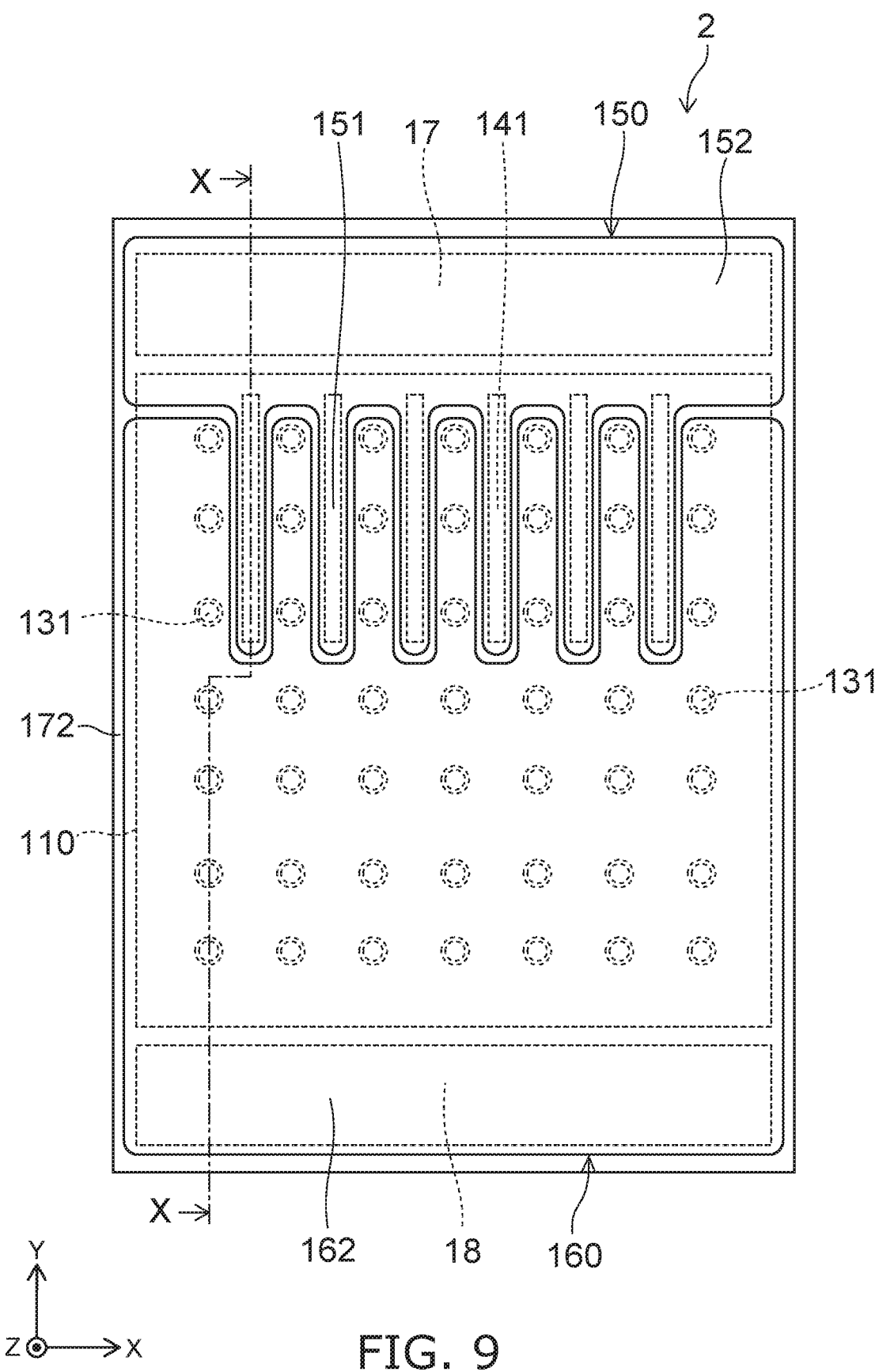
FIG. 9 is a schematic plan view of a second light-emitting element of the light-emitting device shown in FIG. 1.
Figure 10:
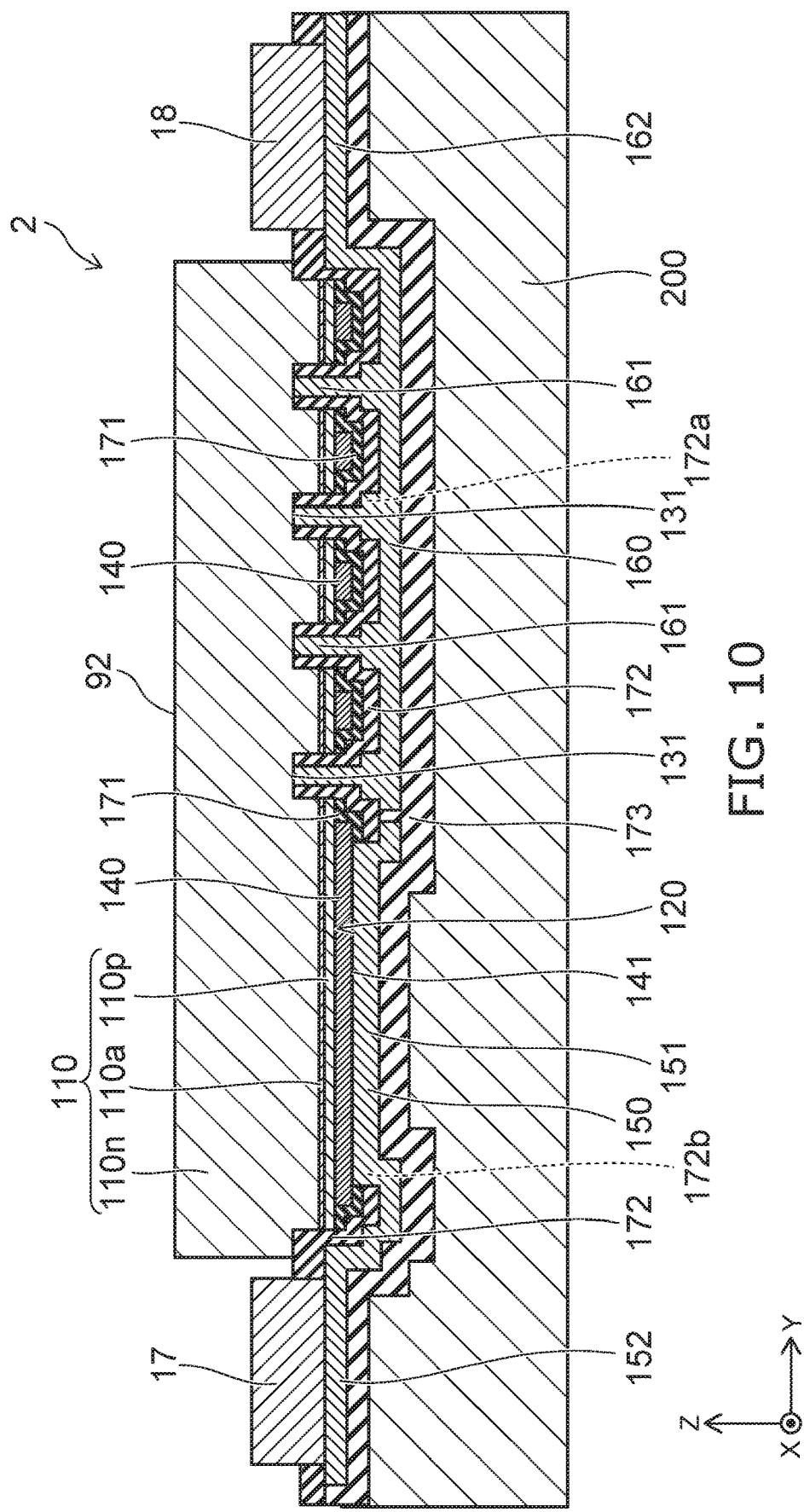
FIG. 10 is a schematic cross-sectional view along line X-X of FIG. 9.

FIG. 9 is a schematic plan view of the second light-emitting element 2. FIG. 10 is a schematic cross-sectional view along line X-X of FIG. 9.

As shown in FIG. 10, the second semiconductor stacked body 110 of the second light-emitting element 2 is disposed on the substrate 200. The first semiconductor stacked body 10 of the first light-emitting element 1 and the second semiconductor stacked body 110 of the second light-emitting element 2 can be disposed on the same substrate 200. Or, the first semiconductor stacked body 10 and the second semiconductor stacked body 110 may be disposed on different substrates.

A third conductive layer 150, a fourth conductive layer 160, the third pad electrode 18, and the fourth pad electrode 17 are disposed on the substrate 200 of the second light-emitting element 2. An insulating layer 172 is disposed partially between the third conductive layer 150 and the second semiconductor stacked body 110 and between the fourth conductive layer 160 and the second semiconductor stacked body 110. An insulating layer 173 that is formed at surfaces of the third conductive layer 150 and the fourth conductive layer 160 is disposed between the third conductive layer 150 and the substrate 200 and between the fourth conductive layer 160 and the substrate 200.

The second semiconductor stacked body 110 is configured similarly to the first semiconductor stacked body 10 shown in FIG. 5 and FIG. 6.

As shown in FIG. 10, the second semiconductor stacked body 110 includes a third semiconductor layer 110p of the p-type, a second light-emitting layer 110a, and a fourth semiconductor layer 110n of the n-type. The second light-emitting layer 110a is disposed between the third semiconductor layer 110p and the fourth semiconductor layer 110n in the third direction Z. The third semiconductor layer 110p is disposed between the substrate 200 and the second light-emitting layer 110a in the third direction Z.

The fourth semiconductor layer 110n includes multiple conductive portions 131 having island configurations. The third semiconductor layer 110p and the second light-emitting layer 110a are not disposed at the conductive portions 131. The conductive portions 131 are the portions electrically connected to the fourth conductive layer 160.

The second semiconductor stacked body 110 includes a mesa portion 120 in which the third semiconductor layer 110p, the second light-emitting layer 110a, and the fourth semiconductor layer 110n are stacked. The mesa portion 120 surrounds the peripheries of the conductive portions 131 when viewed in plan along the third direction Z.

A second electrode 140 is disposed at a surface of the third semiconductor layer 110p of the mesa portion 120. The second electrode 140 is electrically connected to the third semiconductor layer 110p.

An insulating film 171 is disposed at a portion of a surface of the third semiconductor layer 110p to cover the second electrode 140. The insulating film 171 has openings on the second electrode 140, and the second electrode 140 and the third conductive layer 150 are connected in the openings. Connection portions 141 that connect the second electrode 140 and the third conductive layer 150 are positioned in the regions where the openings of the insulating film 171 are disposed. The insulating layer 172 is disposed to cover the insulating film 171 and the side surface of the mesa portion 120.

The arrangement relationship between the insulating layer 172 and the second semiconductor stacked body 110 is similar to the arrangement relationship between the insulating layer 72 and the first semiconductor stacked body 10 shown in FIG. 7.

The insulating layer 172 extends in the first direction Y beyond the portion where the second semiconductor stacked body 110 is positioned. The insulating layer 172 has multiple first openings 172a and multiple second openings 172b. The conductive portions 131 of the fourth semiconductor layer 110n are positioned in the first openings 172a. The connection portions 141 of the second electrode 140 are positioned in the second openings 172b. The third conductive layer 150 and the fourth conductive layer 160 are disposed on the insulating layer 172.

The arrangement relationship between the third conductive layer 150 and the fourth conductive layer 160 is similar to the arrangement relationship between the first conductive layer 50 and the second conductive layer 60 shown in FIG. 8.

The third conductive layer 150 includes first portions 151 and a second portion 152. The first portions 151 and the second portion 152 are formed to have a continuous body of the same material (e.g., a metal material).

The first portions 151 are connected to the connection portions 141 of the second electrode 140 via the openings of the insulating layer 172 and the insulating film 171. As shown in FIG. 9, the multiple first portions 151 are disposed to correspond to the multiple connection portions 141.

The second portion 152 is positioned outside the second semiconductor stacked body 110 in the first direction Y. The first portions 151 extend along the first direction Y from the second portion 152 toward the second semiconductor stacked body 110 side. The multiple first portions 151 are separated from each other in the second direction X.

The fourth conductive layer 160 includes first portions 161 and a second portion 162. The first portions 161 and the second portion 162 are formed to have a continuous body of the same material (e.g., a metal material).

The first portions 161 are connected to the conductive portions 131 of the fourth semiconductor layer 110n via the openings of the insulating layer 172. The first portions 161 are connected respectively to the multiple conductive portions 131. The second portion 162 is positioned outside the second semiconductor stacked body 110 in the first direction Y.

As shown in FIG. 9, in a plan view, the second semiconductor stacked body 110 is positioned between the second portion 152 of the third conductive layer 150 and the second portion 162 of the fourth conductive layer 160 in the first direction Y.

As shown in FIG. 10, the fourth pad electrode 17 is disposed on the second portion 152 of the third conductive layer 150. The second portion 152 is electrically connected to the fourth pad electrode 17. The fourth pad electrode 17 is electrically connected to the third semiconductor layer 110p via the second portion 152 and the first portions 151 of the third conductive layer 150 and the second electrode 140.

The third pad electrode 18 is disposed on the second portion 162 of the fourth conductive layer 160. The second portion 162 is electrically connected to the third pad electrode 18. The third pad electrode 18 is electrically connected to the fourth semiconductor layer 110n via the second portion 162 and the first portions 161 of the fourth conductive layer 160.

As shown in FIG. 1, the multiple connection portions 41 of the first light-emitting element 1 extend along the first direction Y from the vicinity of the third side 13 toward the fourth side 14 of the first semiconductor stacked body 10 and are disposed in a region more proximal to the third side 13 than to the fourth side 14.

The multiple connection portions 141 of the second light-emitting element 2 extend along the first direction Y from the vicinity of the third side 113 toward the fourth side 114 of the second semiconductor stacked body 110 and are disposed in a region more proximal to the third side 113 than to the fourth side 114. The direction from the third side 13 toward the fourth side 14 in the first semiconductor stacked body 10 and the direction from the third side 113 toward the fourth side 114 in the second semiconductor stacked body 110 are reverse directions.

The current that is supplied from the first pad electrode 15 of the first light-emitting element 1 shown in FIG. 4 flows to the second pad electrode 16 via the first conductive layer 50, the first electrode 40, the first semiconductor layer 10p, the first light-emitting layer 10a, the second semiconductor layer 10n, and the second conductive layer 60.

As shown in FIG. 1, the second pad electrode 16 of the first light-emitting element 1 is electrically connected to the fourth pad electrode 17 of the second light-emitting element 2 by the conductive member 19. Accordingly, the current flows from the second pad electrode 16 to the fourth pad electrode 17 via the conductive member 19.

The current that is supplied to the fourth pad electrode 17 flows to the third pad electrode 18 via the third conductive layer 150, the second electrode 140, the third semiconductor layer 110p, the second light-emitting layer 110a, the fourth semiconductor layer 110n, and the fourth conductive layer 160 of the second light-emitting element 2 shown in FIG. 10.

In the first light-emitting element 1, an upper surface 91 of the second semiconductor layer 10n shown in FIG. 4 is a main light-emitting surface. In the second light-emitting element 2, an upper surface 92 of the fourth semiconductor layer 110n shown in FIG. 10 is a main light-emitting surface.

According to the arrangement relationship of the components shown in FIG. 1, the first light-emitting element 1 and the second light-emitting element 2 are arranged next to each other and connected in series; no electrode pads are disposed between the main light-emitting surface (the light-emitting region) of the first light-emitting element 1 and the main light-emitting surface (the light-emitting region) of the second light-emitting element 2; and the dark region that occurs between the main light-emitting surfaces (the light-emitting regions) of the adjacent light-emitting elements 1 and 2 can be small.

Figure 18:
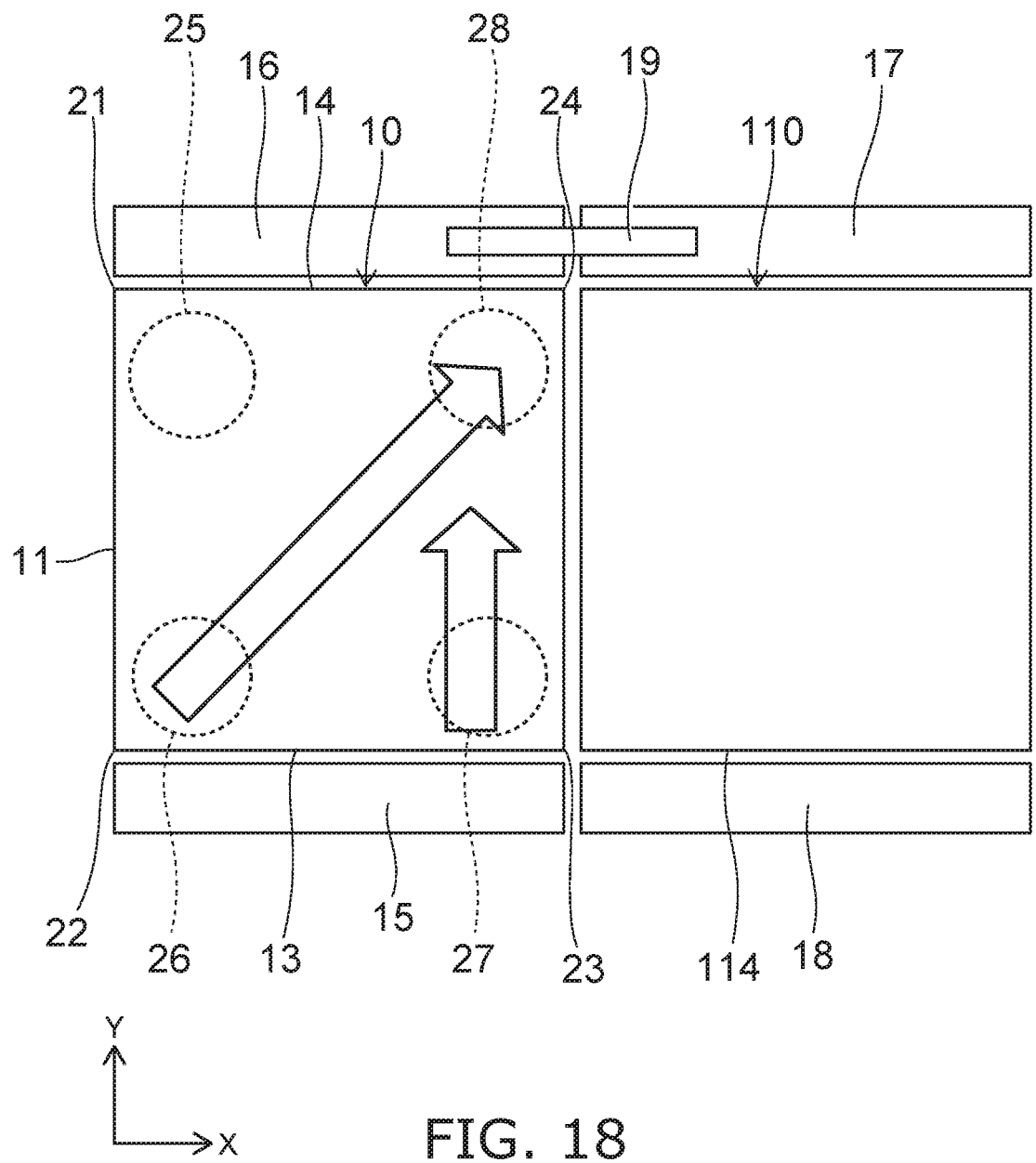
FIG. 18 is a schematic plan view for describing a flow of a current in a light-emitting device of a comparative example.

FIG. 18 is a schematic plan view for describing the flow of the current in a light-emitting device of a comparative example. The same components as FIG. 1 are labeled with the same reference numerals in FIG. 18.

The arrangement relationship of the first semiconductor stacked body 10, the second semiconductor stacked body 110, the first pad electrode 15, the second pad electrode 16, the third pad electrode 18, and the fourth pad electrode 17 shown in FIG. 18 is the same as that of FIG. 1.

For the arrangement relationship of the components shown in FIG. 18, the current easily flows in the directions illustrated by the thick arrows in the first semiconductor stacked body 10 when the current is caused to flow from the first pad electrode 15 to the third pad electrode 18 via the first semiconductor stacked body 10, the second pad electrode 16, the fourth pad electrode 17, and the second semiconductor stacked body 110. This occurs because the current that flows from the first pad electrode 15 to the second pad electrode 16 concentrates easily at the second semiconductor stacked body 110 side.

In other words, for the four regions 25, 26, 27, and 28 described above, the current density decreases easily in the first region 25 compared to the other regions 26, 27, and 28. This may reduce the relative luminance of the first region 25 and cause an uneven luminance distribution in the main light-emitting surface (the light-emitting region) of the first semiconductor stacked body 10.

According to the embodiment as shown in FIG. 1, the multiple conductive portions 31 are disposed in the entire region of the main light-emitting surface including the first region 25, the second region 26, the third region 27, and the fourth region 28; and the density of the conductive portions 31 disposed in the first region 25 is set to be greater than the density of the conductive portions 31 disposed in the second region 26, the density of the conductive portions 31 disposed in the third region 27, and the density of the conductive portions 31 disposed in the fourth region 28. By setting the density of the conductive portions 31 in the first region 25 to be high, the decrease of the relative current density in the first region 25 can be suppressed, and the uneven luminance distribution of the main light-emitting surface (the light-emitting region) in the first semiconductor stacked body 10 can be suppressed.

Figure 11:
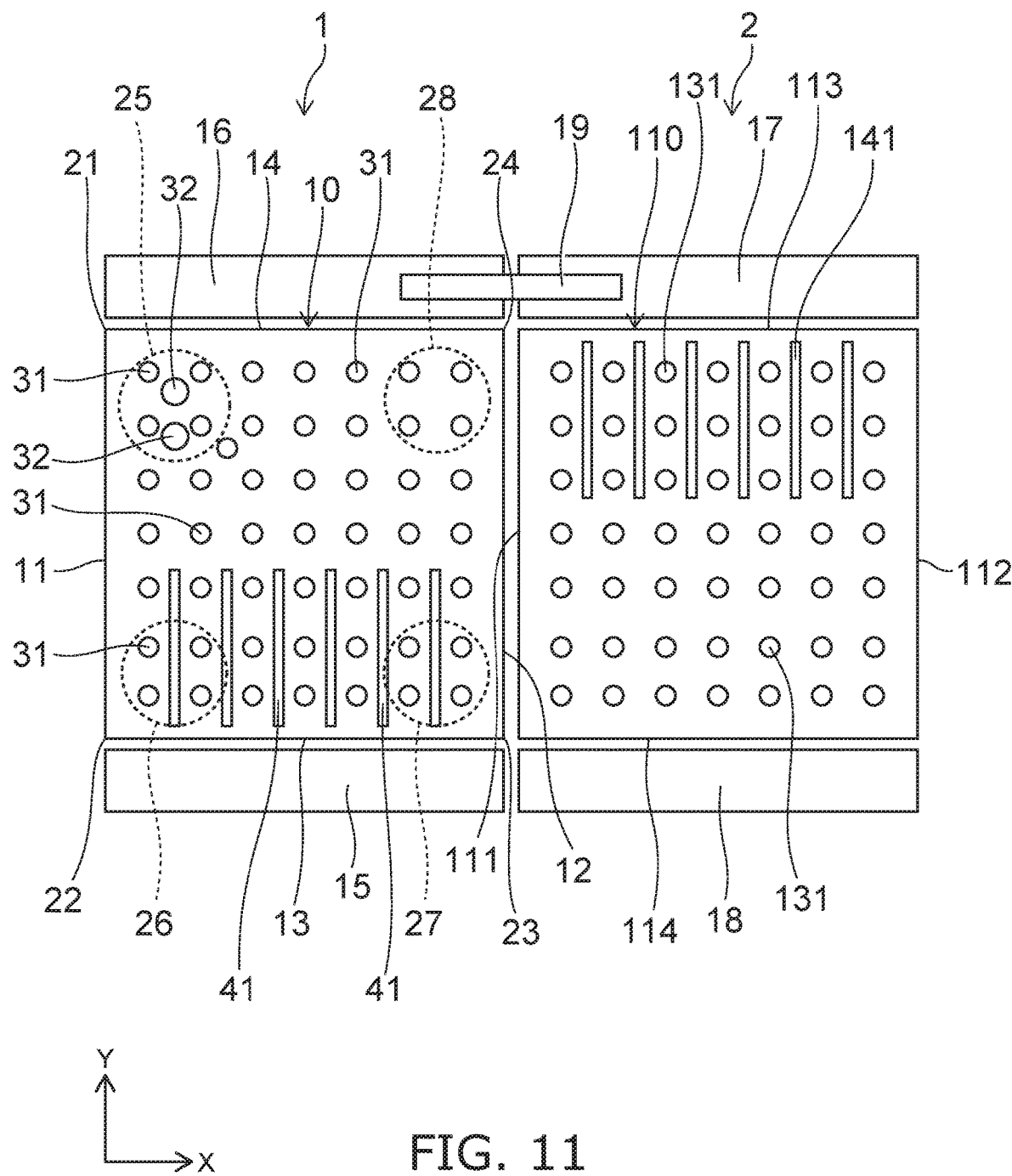
FIG. 11 is a schematic plan view showing another example of the arrangement relationship of the components shown in FIG. 1.

FIG. 11 is a schematic plan view showing another example of the arrangement relationship of the components shown in FIG. 1.

According to this example, the second semiconductor layer 10*n* of the first semiconductor stacked body 10 includes multiple second conductive portions 32 having island configurations in addition to the conductive portions (the first conductive portions) 31 described above. The first conductive portions 31 and the second conductive portions 32 are formed in circular configurations, and the average diameter of the diameters (second diameters) of the second conductive portions 32 is greater than the average diameter of the diameters (first diameters) of the first conductive portions 31. Other than the diameters, the second conductive portions 32 have the same configurations as the first conductive portions 31 and are connected to the first portions 61 of the second conductive layer 60 shown in FIG. 4.

The density of the second conductive portions 32 disposed in the first region 25 is greater than the density of the second conductive portions 32 disposed in the second region 26, the density of the second conductive portions 32 disposed in the third region 27, and the density of the second conductive portions 32 disposed in the fourth region 28.

In the second region 26, the third region 27, and the fourth region 28, only the first conductive portions 31 are disposed, and the second conductive portions 32 are not disposed. In other words, the density of the second conductive portions 32 is zero in the second region 26, the third region 27, and the fourth region 28. However, the second conductive portions 32 may be disposed in at least one of the second region 26, the third region 27, or the fourth region 28 with a density lower than that of the first region 25.

In the example shown in FIG. 11, the density of the second conductive portions 32 disposed in the first region 25 is set to be greater than the densities of the second conductive portions 32 disposed in the other regions 26, 27, and 28. Thereby, as described above, the current easily can be supplied to the first region 25 periphery which has a tendency to have a lower current density than the other regions 26, 27, and 28. As a result, the decrease of the relative current density in the first region 25 can be suppressed, and the uneven luminance distribution of the main light-emitting surface (the light-emitting region) in the first semiconductor stacked body 10 can be suppressed.

Figure 12:
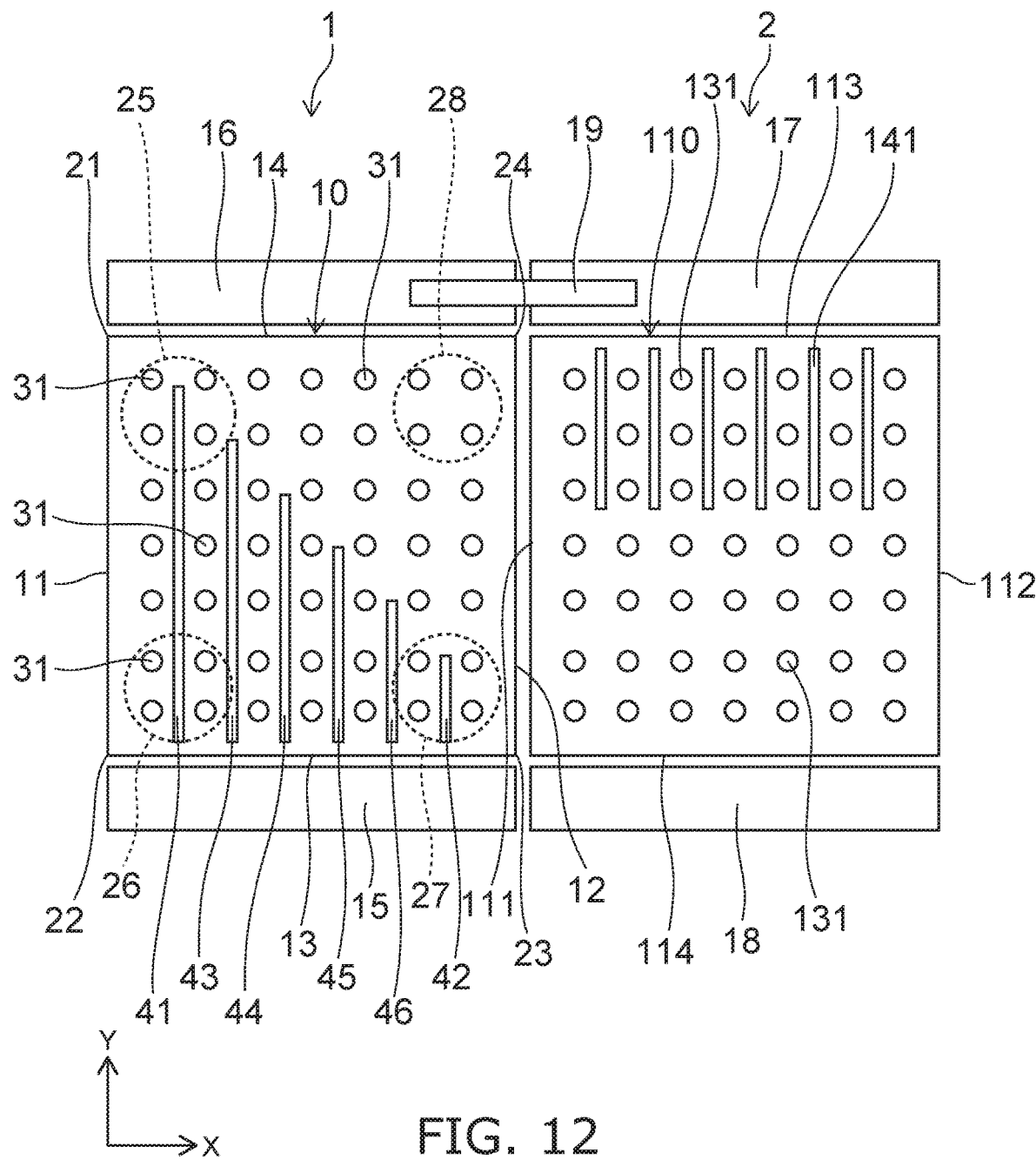
FIG. 12 is a schematic plan view showing another example of the arrangement relationship of the components shown in FIG. 1.

FIG. 12 is a schematic plan view showing another example of the arrangement relationship of the components shown in FIG. 1.

According to this example, the first electrode 40 includes the multiple connection portions 41, 42, 43, 44, 45, and 46 extending along the first direction Y from the vicinity of the third side 13 toward the fourth side 14. Other than the lengths along the first direction Y being different from that of the connection portion 41 described above, the multiple connection portions 41, 42, 43, 44, 45, and 46 are configured similarly to the connection portion 41 described above and contact the first portions 51 of the first conductive layer 50 shown in FIG. 4.

The first connection portion 41 extends from the second region 26 toward the first region 25 and reaches the first region 25. The second connection portion 42 is disposed between the first connection portion 41 and the second side 12 of the first semiconductor stacked body 10 and extends from the third region 27 toward the fourth region 28. The length in the first direction Y of the second connection portion 42 is less than the length in the first direction Y of the first connection portion 41. The shortest distance between the fourth side 14 and the end portion of the first connection portion 41 at the side distal to the third side 13 is less than the shortest distance between the fourth side 14 and the end portion of the second connection portion 42 at the side distal to the third side 13. The second connection portion 42 does not reach the fourth region 28.

The third connection portion 43 is disposed between the first connection portion 41 and the second connection portion 42 in the second direction X. The length in the first direction Y of the third connection portion 43 is less than the length in the first direction Y of the first connection portion 41 and greater than the length in the first direction Y of the second connection portion 42. The shortest distance between the fourth side 14 and the end portion of the third connection portion 43 at the side distal to the third side 13 is greater than the shortest distance between the fourth side 14 and the end portion of the first connection portion 41 at the side distal to the third side 13 and less than the shortest distance between the fourth side 14 and the end portion of the second connection portion 42 at the side distal to the third side 13.

The fourth connection portion 44 is disposed between the third connection portion 43 and the second connection portion 42 in the second direction X. The length in the first direction Y of the fourth connection portion 44 is less than the length in the first direction Y of the third connection portion 43 and greater than the length in the first direction Y of the second connection portion 42. The shortest distance between the fourth side 14 and the end portion of the fourth connection portion 44 at the side distal to the third side 13 is greater than the shortest distance between the fourth side 14 and the end portion of the third connection portion 43 at the side distal to the third side 13 and less than the shortest distance between the fourth side 14 and the end portion of the second connection portion 42 at the side distal to the third side 13.

The fifth connection portion 45 is disposed between the fourth connection portion 44 and the second connection portion 42 in the second direction X. The length in the first direction Y of the fifth connection portion 45 is less than the length in the first direction Y of the fourth connection portion 44 and greater than the length in the first direction Y of the second connection portion 42. The shortest distance between the fourth side 14 and the end portion of the fifth connection portion 45 at the side distal to the third side 13 is greater than the shortest distance between the fourth side 14 and the end portion of the fourth connection portion 44 at the side distal to the third side 13 and less than the shortest distance between the fourth side 14 and the end portion of the second connection portion 42 at the side distal to the third side 13.

The sixth connection portion 46 is disposed between the fifth connection portion 45 and the second connection portion 42 in the second direction X. The length in the first direction Y of the sixth connection portion 46 is less than the length in the first direction Y of the fifth connection portion 45 and greater than the length in the first direction Y of the second connection portion 42. The shortest distance between the fourth side 14 and the end portion of the sixth connection portion 46 at the side distal to the third side 13 is greater than the shortest distance between the fourth side 14 and the end portion of the fifth connection portion 45 at the side distal to the third side 13 and less than the shortest distance between the fourth side 14 and the end portion of the second connection portion 42 at the side distal to the third side 13.

The number of the multiple connection portions 41, 42, 43, 44, 45, and 46 is not limited to six. It is sufficient for the length in the first direction Y of the connection portion 41 extending from the vicinity of the third side 13 toward the first region 25 to be greater than the length in the first direction Y of a connection portion positioned between the connection portion 41 and the second side 12.

The widths in the second direction X are the same for the multiple connection portions 41, 42, 43, 44, 45, and 46. The "same" includes, for example, the degree of differences occurring due to the processes.

The connection portions 41, 42, 43, 44, 45, and 46 are the portions where the first electrode 40 and the first conductive layer 50 are connected and the current from the first pad electrode 15 is supplied. In the example shown in FIG. 12, the length in the first direction Y of the connection portion 41 extending toward the first region 25 is set to be greater than the lengths in the first direction Y of the other connection portions 42, 43, 44, 45, and 46. Thereby, as described above, the current can be supplied easily to the first region 25 periphery which tends to have a lower current density than the other regions 26, 27, and 28. As a result, the decrease of the relative current density in the first region 25 can be suppressed, and the uneven luminance distribution of the main light-emitting surface (the light-emitting region) in the first semiconductor stacked body 10 can be suppressed.

In the embodiment, the lengths in the first direction Y of the connection portions 41, 42, 43, 44, 45, and 46 decrease in stages from the first region 25 toward the fourth region 28. Thereby, an abrupt change of the current density in the main light-emitting surface (the light-emitting region) of the first semiconductor stacked body 10 can be suppressed, and the uneven luminance distribution of the main light-emitting surface (the light-emitting region) in the first semiconductor stacked body 10 can be suppressed further.

Figure 13:
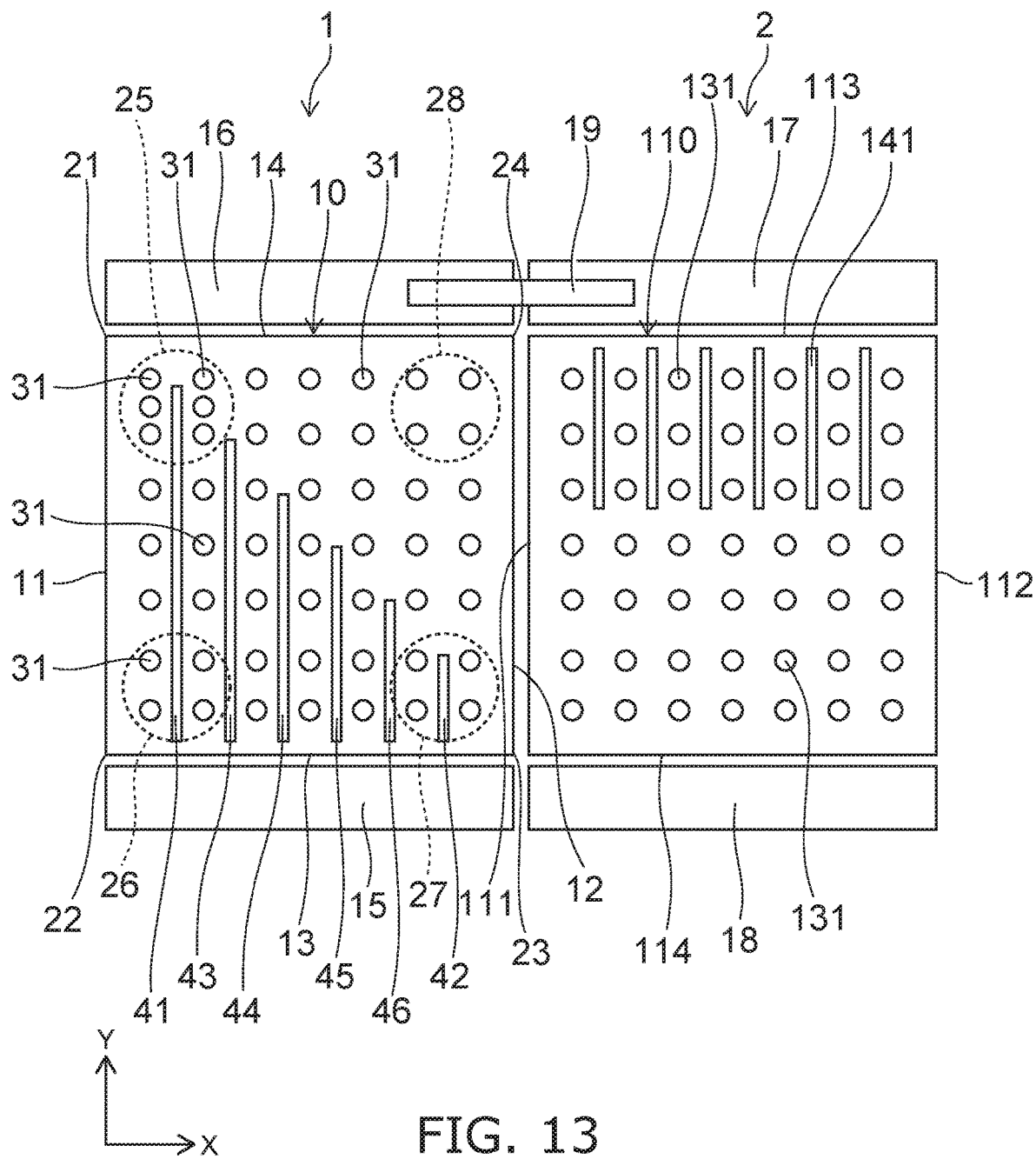
FIG. 13 is a schematic plan view showing another example of the arrangement relationship of the components shown in FIG. 1.

FIG. 13 is a schematic plan view showing another example of the arrangement relationship of the components shown in FIG. 1.

FIG. 13 has a configuration in which the configuration shown in FIG. 1 and the configuration shown in FIG. 12 are combined. In other words, the density of the conductive portions 31 disposed in the first region 25 is set to be greater than the densities of the conductive portions 31 disposed in the other regions 26, 27, and 28; and the length in the first direction Y of the connection portion 41 extending toward the first region 25 is set to be greater than the lengths in the first direction Y of the other connection portions 42, 43, 44, 45, and 46. In this example as well, as described above, the decrease of the relative current density in the first region 25 which tends to have a lower current density than the other regions 26, 27, and 28 can be suppressed, and the uneven luminance distribution of the main light-emitting surface (the light-emitting region) in the first semiconductor stacked body 10 can be suppressed.

Figure 14:
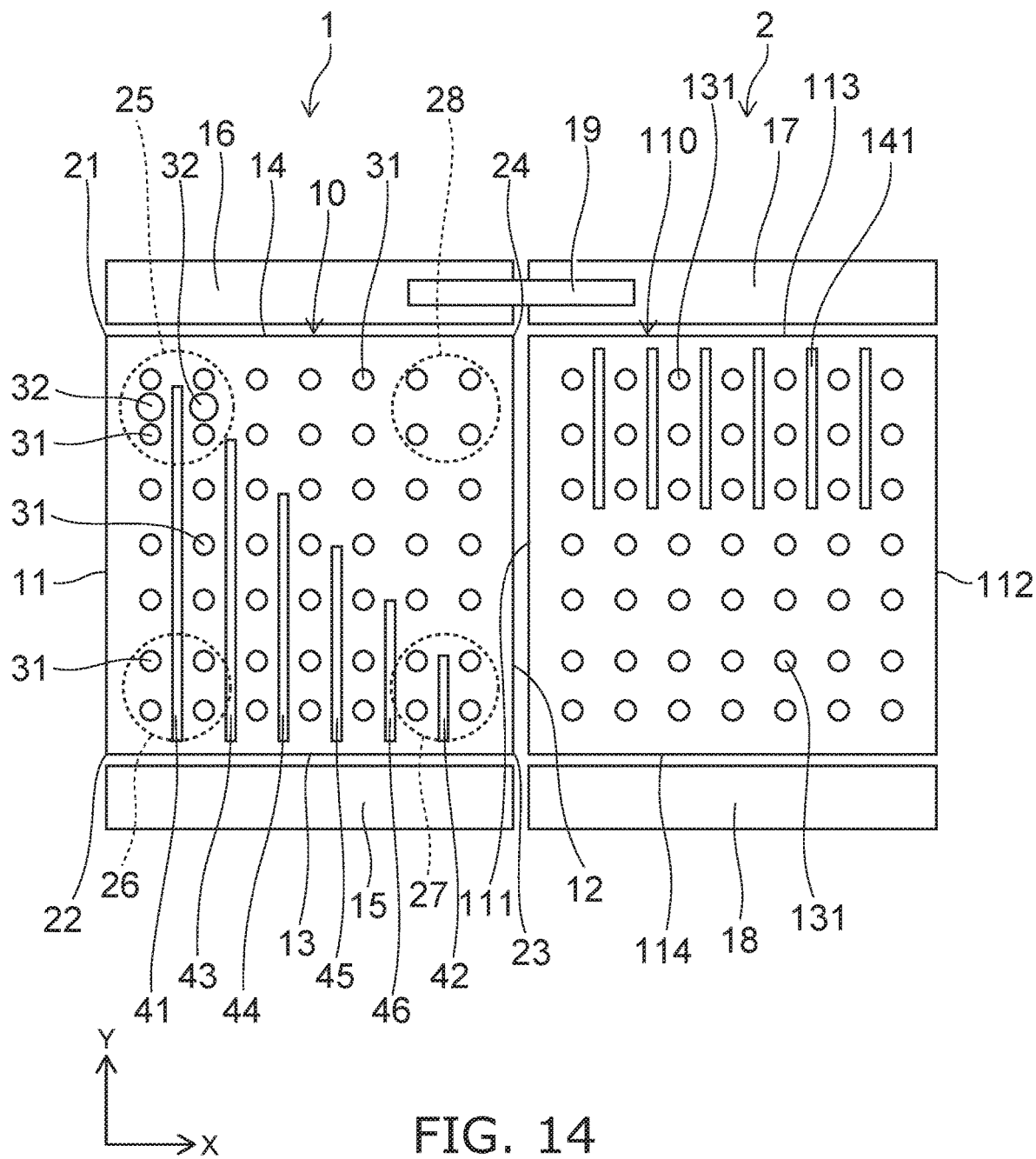
FIG. 14 is a schematic plan view showing another example of the arrangement relationship of the components shown in FIG. 1.

FIG. 14 is a schematic plan view showing another example of the arrangement relationship of the components shown in FIG. 1.

FIG. 14 has a configuration in which the configuration shown in FIG. 11 and the configuration shown in FIG. 12 are combined. In other words, the density of the second conductive portions 32 disposed in the first region 25 is set to be greater than the densities of the second conductive portions 32 disposed in the other regions 26, 27, and 28, and the length in the first direction Y of the connection portion 41 extending toward the first region 25 is set to be greater than the lengths in the first direction Y of the other connection portions 42, 43, 44, 45, and 46. In this example as well, as described above, the decrease of the relative current density in the first region 25 which tends to have a lower current density than the other regions 26, 27, and 28 can be suppressed, and the uneven luminance distribution of the main light-emitting surface (the light-emitting region) in the first semiconductor stacked body 10 can be suppressed.

Figure 15:
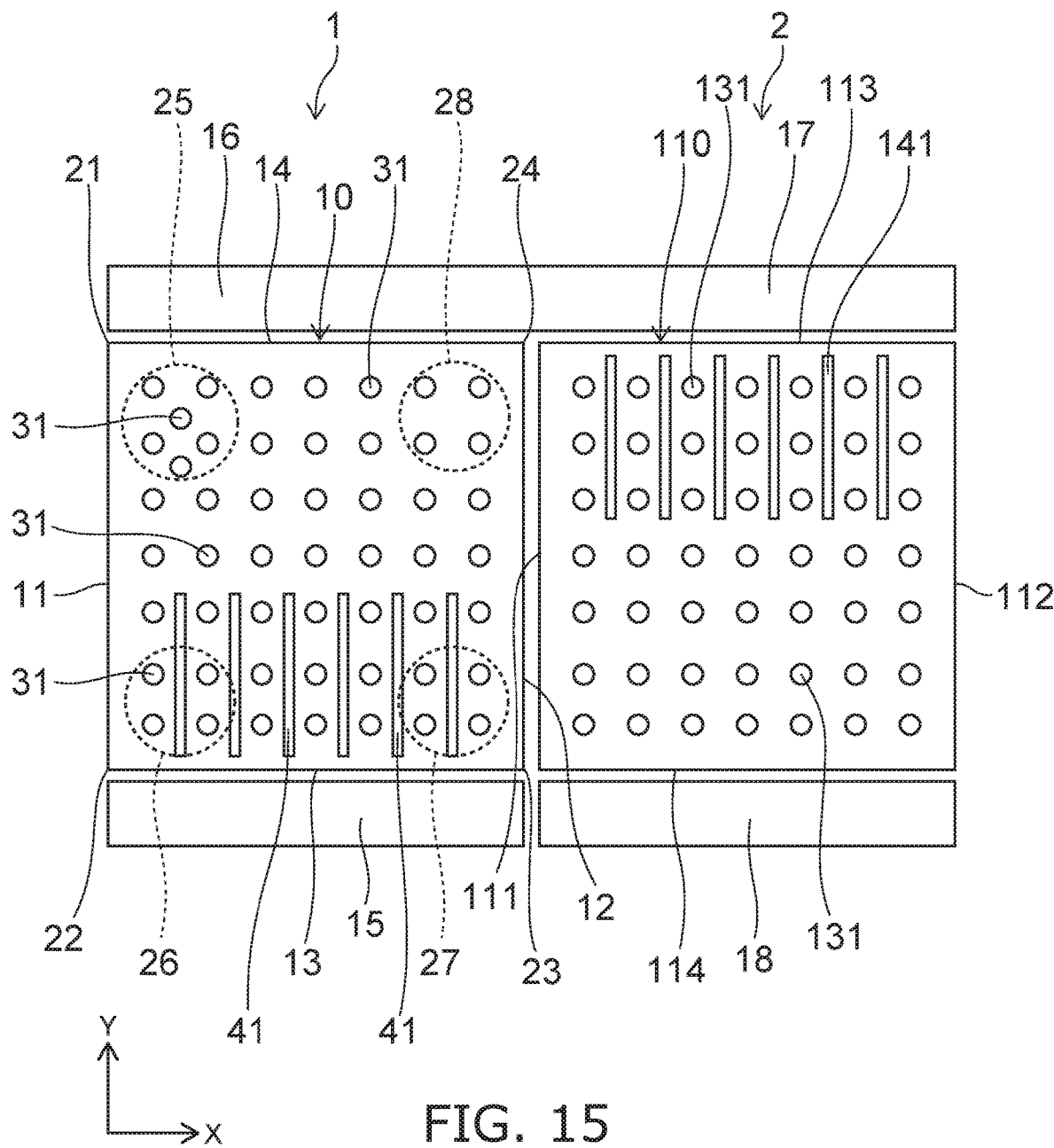
FIG. 15 is a schematic plan view showing another example of the arrangement relationship of the components shown in FIG. 1.

FIG. 15 is a schematic plan view showing another example of the arrangement relationship of the components shown in FIG. 1.

In this example, the second pad electrode 16 of the first light-emitting element 1 and the fourth pad electrode 17 of the second light-emitting element 2 are formed to have a continuous body. For example, the second pad electrode 16 and the fourth pad electrode 17 are formed as a continuous metal film. By such a structure, the processes can be simplified because it is unnecessary to perform a process of connecting the second pad electrode 16 and the fourth pad electrode 17 by a conductive member.

Figure 16:
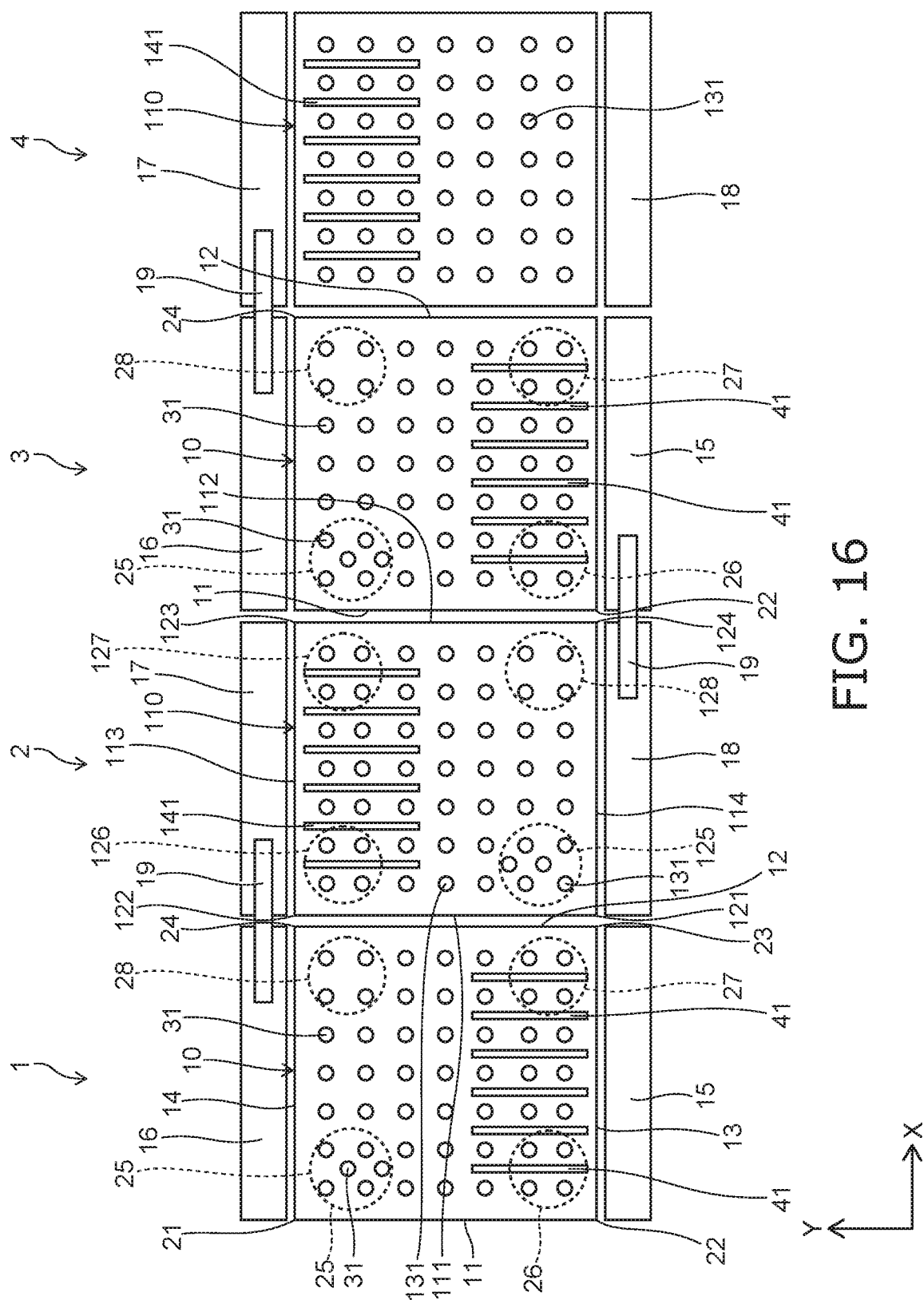
FIG. 16 is a schematic plan view showing an arrangement relationship of major components of a light-emitting device of another embodiment of the invention.
Figure 17:
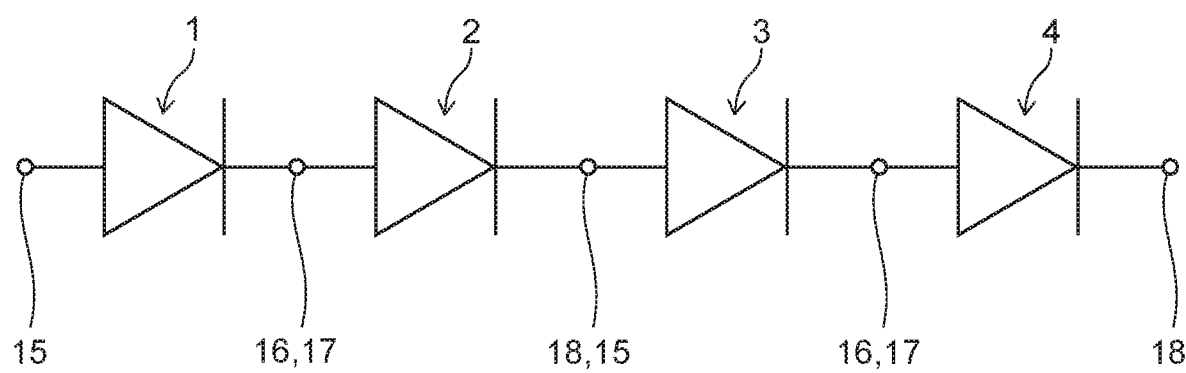
FIG. 17 is an equivalent circuit diagram of the light-emitting device shown in FIG. 16.

FIG. 16 is a schematic plan view showing the arrangement relationship of the main components of a light-emitting device of another embodiment of the invention. FIG. 17 is an equivalent circuit diagram of the light-emitting device shown in FIG. 16.

The light-emitting device further includes a third light-emitting element 3 and a fourth light-emitting element 4 in addition to the first light-emitting element 1 and the second light-emitting element 2 shown in FIG. 1.

The second light-emitting element 2 includes a first region 125, a second region 126, a third region 127, and a fourth region 128. The first region 125 is positioned at the periphery of a first corner 121 between the first side 111 and the fourth side 114 of the second semiconductor stacked body 110. The second region 126 is positioned at the periphery of a second corner 122 between the first side 111 and the third side 113. The third region 127 is positioned at the periphery of a third corner 123 between the second side 112 and the third side 113. The fourth region 128 is positioned at the periphery of a fourth corner 124 between the second side 112 and the fourth side 114.

The third light-emitting element 3 has the same configuration as the first light-emitting element 1. Namely, the third light-emitting element 3 includes the first semiconductor stacked body 10, the first pad electrode 15, and the second pad electrode 16.

The fourth light-emitting element 4 has the same configuration as the second light-emitting element 2. Namely, the fourth light-emitting element 4 includes the second semiconductor stacked body 110, the third pad electrode 18, and the fourth pad electrode 17.

Similarly to the first light-emitting element 1, the first semiconductor stacked body 10 of the third light-emitting element 3 is disposed between the first pad electrode 15 and the second pad electrode 16 in the first direction Y. Similarly to the second light-emitting element 2, the second semiconductor stacked body 110 of the fourth light-emitting element 4 is disposed between the third pad electrode 18 and the fourth pad electrode 17 in the first direction Y.

The first pad electrode 15 of the third light-emitting element 3 is next to the third pad electrode 18 of the second light-emitting element 2 in the second direction X. The third pad electrode 18 of the second light-emitting element 2 and the first pad electrode 15 of the third light-emitting element 3 are electrically connected to each other by the conductive member 19.

The second pad electrode 16 of the third light-emitting element 3 is next to the fourth pad electrode 17 of the second light-emitting element 2 in the second direction X. The fourth pad electrode 17 of the fourth light-emitting element 4 is next to the second pad electrode 16 of the third light-emitting element 3 in the second direction X. The second pad electrode 16 of the third light-emitting element 3 and the fourth pad electrode 17 of the fourth light-emitting element 4 are electrically connected to each other by the conductive member 19.

The third pad electrode 18 of the fourth light-emitting element 4 is next to the first pad electrode 15 of the third light-emitting element 3 in the second direction X.

Configurations of the light-emitting device shown in FIG. 1 are next to each other in the second direction X. The first light-emitting element 1, the second light-emitting element 2, the third light-emitting element 3, and the fourth light-emitting element 4 are arranged in the second direction X. The second semiconductor stacked body 110 of the second light-emitting element 2 is positioned between the first semiconductor stacked body 10 of the first light-emitting element 1 and the first semiconductor stacked body 10 of the third light-emitting element 3. The first semiconductor stacked body 10 of the third light-emitting element 3 is positioned between the second semiconductor stacked body 110 of the second light-emitting element 2 and the second semiconductor stacked body 110 of the fourth light-emitting element 4.

As shown in FIG. 17, the first light-emitting element 1, the second light-emitting element 2, the third light-emitting element 3, and the fourth light-emitting element 4 are connected in series between the first pad electrode 15 of the first light-emitting element 1 and the third pad electrode 18 of the fourth light-emitting element 4.

The current that is supplied to the first pad electrode 15 of the first light-emitting element 1 flows to the third pad electrode 18 of the fourth light-emitting element 4 via the first semiconductor stacked body 10 of the first light-emitting element 1, the second pad electrode 16 of the first light-emitting element 1, the fourth pad electrode 17 of the second light-emitting element 2, the second semiconductor stacked body 110 of the second light-emitting element 2, the third pad electrode 18 of the second light-emitting element 2, the first pad electrode 15 of the third light-emitting element 3, the first semiconductor stacked body 10 of the third light-emitting element 3, the second pad electrode 16 of the third light-emitting element 3, the fourth pad electrode 17 of the fourth light-emitting element 4, and the second semiconductor stacked body 110 of the fourth light-emitting element 4.

According to the arrangement relationship of the components shown in FIG. 16, the first light-emitting element 1, the second light-emitting element 2, the third light-emitting element 3, and the fourth light-emitting element 4 are arranged next to each other and connected in series; no electrode pads are disposed between the main light-emitting surfaces (the light-emitting regions) of the light-emitting elements 1, 2, 3, and 4; and the dark regions that occur between the main light-emitting surfaces (the light-emitting regions) of the adjacent light-emitting elements of the light-emitting elements 1, 2, 3, and 4 can be small.

The second pad electrode 16 of the first light-emitting element 1 next to the first side 111 of the second light-emitting element 2 and the first pad electrode 15 of the third light-emitting element 3 next to the second side 112 of the second light-emitting element 2 are positioned at two opposite corners (the second corner 122 and the fourth corner 124) of the second semiconductor stacked body 110 of the second light-emitting element 2. Therefore, the current flows easily in the direction from the second region 126 toward the fourth region 128 in the second semiconductor stacked body 110 of the second light-emitting element 2.

Therefore, the current density in the first region 125 of the second light-emitting element 2 easily becomes less than those of the second region 126 and the fourth region 128. Therefore, by setting the density of the conductive portions 131 disposed in the first region 125 of the second light-emitting element 2 to be greater than the density of the conductive portions 131 disposed in the second region 126 and the density of the conductive portions 131 disposed in the fourth region 128, the decrease of the relative current density in the first region 125 of the second light-emitting element 2 can be suppressed, and the uneven luminance distribution in the main light-emitting surface (the light-emitting region) of the second semiconductor stacked body 110 of the second light-emitting element 2 can be suppressed.

In the second semiconductor stacked body 110 of the second light-emitting element 2, the current flows easily in the direction from the second region 126 toward the fourth region 128; therefore, in the third region 127 as well, the current density easily becomes less than those of the second region 126 and the fourth region 128. Therefore, the density of the conductive portions 131 disposed in the third region 127 may be set to be greater than the density of the conductive portions 131 disposed in the second region 126 and the density of the conductive portions 131 disposed in the fourth region 128.

The third pad electrode 18 of the second light-emitting element 2 next to the first side 11 of the third light-emitting element 3 and the fourth pad electrode 17 of the fourth light-emitting element 4 next to the second side 12 of the third light-emitting element 3 are positioned at two opposite corners (the second corner 22 and the fourth corner 24) of the first semiconductor stacked body 10 of the third light-emitting element 3. Therefore, the current flows easily in the direction from the second region 26 toward the fourth region 28 in the first semiconductor stacked body 10 of the third light-emitting element 3.

Therefore, the current density in the first region 25 of the third light-emitting element 3 easily becomes less than those of the second region 26 and the fourth region 28. Therefore, by setting the density of the conductive portions 31 disposed in the first region 25 of the third light-emitting element 3 to be greater than the density of the conductive portions 31 disposed in the second region 26 and the density of the conductive portions 31 disposed in the fourth region 28, the decrease of the relative current density in the first region 25 of the third light-emitting element 3 can be suppressed, and the uneven luminance distribution of the main light-emitting surface (the light-emitting region) in the first semiconductor stacked body 10 of the third light-emitting element 3 can be suppressed.

In the first semiconductor stacked body 10 of the third light-emitting element 3, the current flows easily in the direction from the second region 26 toward the fourth region 28; therefore, in the third region 27 as well, the current density easily becomes less than those of the second region 26 and the fourth region 28. Therefore, the density of the conductive portions 31 disposed in the third region 27 may be set to be greater than the density of the conductive portions 31 disposed in the second region 26 and the density of the conductive portions 31 disposed in the fourth region 28.

According to the embodiment, in the first semiconductor stacked bodies 10 and the second semiconductor stacked body 110 of the first light-emitting element 1, the second light-emitting element 2, and the third light-emitting element 3, by setting at least the densities of the conductive portions 31 and 131 of the first regions 25 and 125 to be greater than the densities of the conductive portions 31 and 131 of the second regions 26 and 126 and the densities of the conductive portions 31 and 131 of the fourth regions 28 and 128 positioned at the peripheries of the opposite-angle positions where the current flows easily, the current density distribution in the main light-emitting surfaces (the light-emitting regions) of the first semiconductor stacked bodies 10 and the second semiconductor stacked body 110 can be made uniform, and the uneven luminance distribution can be suppressed.

The first regions 25 and 125 are not limited to the configuration of FIG. 16, and the configuration of FIG. 11, FIG. 12, FIG. 13, or FIG. 14 described above is applicable.

The number of light-emitting elements arranged in the second direction X and connected in series is not limited to the numbers shown in FIG. 1 and FIG. 16 and may be three, five, or more. In any case, by applying the configuration described above to the regions where the current does not flow easily, the current density distribution can be made uniform, and the uneven luminance distribution can be suppressed.

The embodiments of the present disclosure have been described with reference to specific examples. However, the present disclosure is not limited to these specific examples. Based on the above-described embodiments of the present disclosure, all embodiments that can be implemented with appropriately design modification by one skilled in the art are also within the scope of the present disclosure as long as the gist of the present disclosure is included. Besides, within the scope of the spirit of the present disclosure, one skilled in the art can conceive various modifications, and the modifications fall within the scope of the present disclosure.

What is claimed is:

1. A light-emitting device, comprising:
a first pad electrode;
a second pad electrode disposed to be separated from the first pad electrode;
a first semiconductor stacked body disposed between the first pad electrode and the second pad electrode in a first direction, the first direction being from the first pad electrode toward the second pad electrode, the first semiconductor stacked body comprising a first semiconductor layer of a first conductivity type, a second semiconductor layer of a second conductivity type, and a first light-emitting layer disposed between the first semiconductor layer and the second semiconductor layer;
a third pad electrode next to the first pad electrode in a second direction orthogonal to the first direction;
a fourth pad electrode next to the second pad electrode in the second direction and disposed to be separated from the third pad electrode in the first direction;
a second semiconductor stacked body disposed between the third pad electrode and the fourth pad electrode in the first direction, the second semiconductor stacked body comprising a third semiconductor layer of the first conductivity type, a fourth semiconductor layer of the second conductivity type, and a second light-emitting layer disposed between the third semiconductor layer and the fourth semiconductor layer;
a first conductive layer electrically connecting the first semiconductor layer and the first pad electrode;
a second conductive layer electrically connecting the second semiconductor layer and the second pad electrode;
a third conductive layer electrically connecting the third semiconductor layer and the fourth pad electrode;
a fourth conductive layer electrically connecting the fourth semiconductor layer and the third pad electrode; and
a conductive member electrically connecting the second pad electrode and the fourth pad electrode,
the second semiconductor layer comprising a plurality of conductive portions contacting the second conductive layer and having island configurations,
the first semiconductor stacked body having a first side along the first direction, a second side along the first direction, a third side along the second direction, and a fourth side along the second direction, the second side being disposed between the first side and the second semiconductor stacked body, the fourth side being disposed between the third side and the second pad electrode,
the conductive portions being disposed in a first region, a second region, a third region, and a fourth region, the first region being positioned at a periphery of a first corner between the first side and the fourth side of the first semiconductor stacked body, the second region being positioned at a periphery of a second corner between the first side and the third side of the first semiconductor stacked body, the third region being positioned at a periphery of a third corner between the second side and the third side of the first semiconductor stacked body, the fourth region being positioned at a periphery of a fourth corner between the second side and the fourth side of the first semiconductor stacked body, a density of the conductive portions disposed in the first region being greater than densities of the conductive portions disposed in the second region, the third region, and the fourth region.

2. The light-emitting device according to claim 1, wherein an average diameter of a plurality of the conductive portions disposed in the first region is greater than average diameters of the conductive portions disposed in the second region, the third region, and the fourth region.

3. The light-emitting device according to claim 1, further comprising a first electrode disposed on the first semiconductor layer, the first electrode comprising a plurality of connection portions extending along the first direction from a vicinity of the third side toward the fourth side of the first semiconductor stacked body, the plurality of connection portions contacting the first conductive layer, the plurality of connection portions comprising a first connection portion and a second connection portion, the first connection portion extending toward the first region, the second connection portion being disposed between the first connection portion and the second side of the first semiconductor stacked body, and being shorter in the first direction than the first connection portion.

4. The light-emitting device according to claim 3, wherein a width in the second direction of the first connection portion is equal to a width in the second direction of the second connection portion.

5. A light-emitting device, comprising:
a first pad electrode;
a second pad electrode disposed to be separated from the first pad electrode;
a first semiconductor stacked body disposed between the first pad electrode and the second pad electrode in a first direction, the first direction being from the first pad electrode toward the second pad electrode, the first semiconductor stacked body comprising a first semiconductor layer of a first conductivity type, a second semiconductor layer of a second conductivity type, and a first light-emitting layer disposed between the first semiconductor layer and the second semiconductor layer;
a third pad electrode next to the first pad electrode in a second direction orthogonal to the first direction;
a fourth pad electrode next to the second pad electrode in the second direction and disposed to be separated from the third pad electrode in the first direction;
a second semiconductor stacked body comprising a third semiconductor layer of the first conductivity type, a fourth semiconductor layer of the second conductivity type, and a second light-emitting layer disposed between the third semiconductor layer and the fourth semiconductor layer;

a first conductive layer electrically connecting the first semiconductor layer and the first pad electrode;
a second conductive layer electrically connecting the second semiconductor layer and the second pad electrode;
a third conductive layer electrically connecting the third semiconductor layer and the fourth pad electrode;
a fourth conductive layer electrically connecting the fourth semiconductor layer and the third pad electrode; and
a conductive member electrically connecting the second pad electrode and the fourth pad electrode,
the second semiconductor layer comprising conductive portions comprising a plurality of first conductive portions and a plurality of second conductive portions, the first conductive portions contacting the second conductive layer and having island configurations having first diameters, the second conductive portions contacting the second conductive layer and having island configurations having second diameters greater than the first diameters,
the first semiconductor stacked body having a first side along the first direction, a second side along the first direction, a third side along the second direction, and a fourth side along the second direction, the second side being disposed between the first side and the second semiconductor stacked body, the fourth side being disposed between the third side and the second pad electrode,
the conductive portions being disposed in a first region, a second region, a third region, and a fourth region, the first region being positioned at a periphery of a first corner between the first side and the fourth side of the first semiconductor stacked body, the second region being positioned at a periphery of a second corner between the first side and the third side of the first semiconductor stacked body, the third region being positioned at a periphery of a third corner between the second side and the third side of the first semiconductor stacked body, the fourth region being positioned at a periphery of a fourth corner between the second side and the fourth side of the first semiconductor stacked body,
a density of the second conductive portions disposed in the first region being greater than densities of the second conductive portions disposed in the second region, the third region, and the fourth region.

6. A light-emitting device, comprising:
a first pad electrode;
a second pad electrode disposed to be separated from the first pad electrode;
a first semiconductor stacked body disposed between the first pad electrode and the second pad electrode in a first direction, the first direction being from the first pad electrode toward the second pad electrode, the first semiconductor stacked body comprising a first semiconductor layer of a first conductivity type, a second semiconductor layer of a second conductivity type, and a first light-emitting layer disposed between the first semiconductor layer and the second semiconductor layer;
a third pad electrode next to the first pad electrode in a second direction orthogonal to the first direction;
a fourth pad electrode next to the second pad electrode in the second direction and disposed to be separated from the third pad electrode in the first direction;

a second semiconductor stacked body comprising a third semiconductor layer of the first conductivity type, a fourth semiconductor layer of the second conductivity type, and a second light-emitting layer disposed between the third semiconductor layer and the fourth semiconductor layer;

a first conductive layer electrically connecting the first semiconductor layer and the first pad electrode;

a second conductive layer electrically connecting the second semiconductor layer and the second pad electrode;

a third conductive layer electrically connecting the third semiconductor layer and the fourth pad electrode;

a fourth conductive layer electrically connecting the fourth semiconductor layer and the third pad electrode;

a conductive member electrically connecting the second pad electrode and the fourth pad electrode; and a first electrode disposed on the first semiconductor layer, the second semiconductor layer comprising a plurality of conductive portions contacting the second conductive layer and having island configurations, the first semiconductor stacked body having a first side along the first direction, a second side along the first direction, a third side along the second direction, and a fourth side along the second direction, the second side being disposed between the first side and the second semiconductor stacked body, the fourth side being disposed between the third side and the second pad electrode, the first electrode comprising a plurality of connection portions extending along the first direction from a vicinity of the third side toward the fourth side of the first semiconductor stacked body, the plurality of connection portions contacting the first conductive layer, the plurality of connection portions comprising a first connection portion and a second connection portion, the first connection portion extending toward a first region positioned at a periphery of a first corner between the first side and the fourth side of the first semiconductor stacked body, the second connection portion being disposed between the first connection portion and the second side of the first semiconductor stacked body, and being shorter in the first direction than the first connection portion.

7. The light-emitting device according to claim 6, wherein a width in the second direction of the first connection portion is equal to a width in the second direction of the second connection portion.

\* \* \* \* \*